US012550781B2

(12) United States Patent
Karhade et al.

(10) Patent No.: US 12,550,781 B2
(45) Date of Patent: Feb. 10, 2026

(54) TEMPLATE STRUCTURE FOR QUASI-MONOLITHIC DIE ARCHITECTURES

(71) Applicant: Intel Corporation, Santa Clara, CA (US)

(72) Inventors: Omkar G. Karhade, Chandler, AZ (US); Tomita Yoshihiro, Tsukuba (JP); Adel A. Elsherbini, Chandler, AZ (US); Bhaskar Jyoti Krishnatreya, Hillsboro, OR (US); Tushar Talukdar, Wilsonville, OR (US); Haris Khan Niazi, Scottsdale, AZ (US); Yi Shi, Chandler, AZ (US); Batao Zhang, Gilbert, AZ (US); Wenhao Li, Chandler, AZ (US); Feras Eid, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 571 days.

(21) Appl. No.: 17/891,665

(22) Filed: Aug. 19, 2022

(65) Prior Publication Data

US 2024/0063066 A1   Feb. 22, 2024

(51) Int. Cl.
*H01L 23/06* (2006.01)
*H01L 23/00* (2006.01)
(Continued)

(52) U.S. Cl.
CPC ............ *H01L 23/041* (2013.01); *H01L 23/18* (2013.01); *H01L 23/367* (2013.01); *H01L 23/46* (2013.01);
(Continued)

(58) Field of Classification Search
CPC ........ H01L 23/06; H01L 23/04; H01L 23/043
See application file for complete search history.

(56) References Cited

U.S. PATENT DOCUMENTS 10,062,652 B2 *  8/2018  Lee ......................... H01L 24/19
10,818,570 B1    10/2020  England et al.
(Continued)

FOREIGN PATENT DOCUMENTS

CN    113035801 A    6/2021
EP      3772098 A1   2/2021

OTHER PUBLICATIONS

U.S. Appl. No. 17/557,925, filed Dec. 21, 2021 and entitled Edge-Aligned Template Structure for Integrated Circuit Packages.
(Continued)

*Primary Examiner* — Errol V Fernandes
(74) *Attorney, Agent, or Firm* — Akona IP PC

(57) ABSTRACT

Microelectronic assemblies, related devices and methods, are disclosed herein. In some embodiments, a microelectronic assembly may include a first die having a surface; a template structure having a first surface and an opposing second surface, wherein the first surface of the template structure is coupled to the surface of the first die, and wherein the template structure includes a cavity at the first surface and a through-template opening extending from a top surface of the cavity to the second surface of the template structure; and a second die within the cavity of the template structure and electrically coupled to the surface of the first die by interconnects having a pitch of less than 10 microns between adjacent interconnects.

20 Claims, 15 Drawing Sheets

(51) Int. Cl.

| | |
|---|---|
| *H01L 23/04* | (2006.01) |
| *H01L 23/18* | (2006.01) |
| *H01L 23/367* | (2006.01) |
| *H01L 23/46* | (2006.01) |
| *H01L 23/48* | (2006.01) |
| *H01L 25/065* | (2023.01) |

(52) U.S. Cl.
CPC ............ *H01L 23/481* (2013.01); *H01L 24/08* (2013.01); *H01L 25/0652* (2013.01); *H01L 24/05* (2013.01); *H01L 24/13* (2013.01); *H01L 24/16* (2013.01); *H01L 24/29* (2013.01); *H01L 24/32* (2013.01); *H01L 24/73* (2013.01); *H01L 24/80* (2013.01); *H01L 2224/05599* (2013.01); *H01L 2224/08145* (2013.01); *H01L 2224/131* (2013.01); *H01L 2224/16227* (2013.01); *H01L 2224/29099* (2013.01); *H01L 2224/32225* (2013.01); *H01L 2224/73204* (2013.01); *H01L 2224/80379* (2013.01)

(56) References Cited

U.S. PATENT DOCUMENTS

| | | | |
|---|---|---|---|
| 10,957,670 B2 * | 3/2021 | Kim | .................. H01L 24/20 |
| 11,694,959 B2 | 7/2023 | Ganesan et al. | |
| 2004/0018696 A1 | 1/2004 | Wieczorek et al. | |
| 2007/0086168 A1 | 4/2007 | Khanna et al. | |
| 2013/0249085 A1 | 9/2013 | Ide | |
| 2015/0318246 A1 | 11/2015 | Yu et al. | |
| 2016/0099214 A1 | 4/2016 | Dalal et al. | |
| 2016/0260685 A1 | 9/2016 | Tremlett et al. | |
| 2018/0061775 A1 | 3/2018 | Velez et al. | |
| 2019/0131242 A1 | 5/2019 | Lee et al. | |
| 2020/0118973 A1 | 4/2020 | Wang et al. | |
| 2020/0321257 A1 * | 10/2020 | Kang | .................. H01L 24/20 |
| 2020/0343218 A1 | 10/2020 | Hu et al. | |
| 2021/0028080 A1 | 1/2021 | Pietambaram et al. | |
| 2021/0035911 A1 | 2/2021 | Ganesan et al. | |
| 2021/0159179 A1 | 5/2021 | Elsherbini et al. | |
| 2021/0257335 A1 | 8/2021 | Shih | |
| 2021/0305162 A1 | 9/2021 | Ganesan et al. | |
| 2021/0375757 A1 * | 12/2021 | Cho | .................. H01L 23/5283 |
| 2022/0344304 A1 | 10/2022 | Pan et al. | |
| 2022/0392855 A1 | 12/2022 | Darmawikarta et al. | |
| 2023/0136656 A1 | 5/2023 | Lai et al. | |
| 2023/0378132 A1 | 11/2023 | Shen et al. | |

OTHER PUBLICATIONS

U.S. Appl. No. 17/557,945, filed Dec. 21, 2021 and entitled Edge-Aligned Template Structure for Integrated Circuit Packages.
U.S. Appl. No. 17/891,530, filed Aug. 19, 2022, Adel A. Elsherbini.
U.S. Appl. No. 17/891,536, filed Aug. 19, 2022, Adel A. Elsherbini.
U.S. Appl. No. 17/891,560, filed Aug. 19, 2022, Adel A. Elsherbini.
U.S. Appl. No. 17/891,654, filed Aug. 19, 2022, Adel A. Elsherbini.
U.S. Appl. No. 17/891,666, filed Aug. 19, 2022, Adel A. Elsherbini.
U.S. Appl. No. 17/891,690, filed Aug. 19, 2022, Adel A. Elsherbini.
U.S. Appl. No. 17/891,704, filed Aug. 19, 2022, Adel A. Elsherbini.
U.S. Appl. No. 17/891,727, filed Aug. 19, 2022, Adel A. Elsherbini.
U.S. Appl. No. 17/891,735, filed Aug. 19, 2022, Adel A. Elsherbini.
U.S. Appl. No. 17/891,738, filed Aug. 19, 2022, Adel A. Elsherbini.
U.S. Appl. No. 17/891,880, filed Aug. 19, 2022, Adel A. Elsherbini.

* cited by examiner

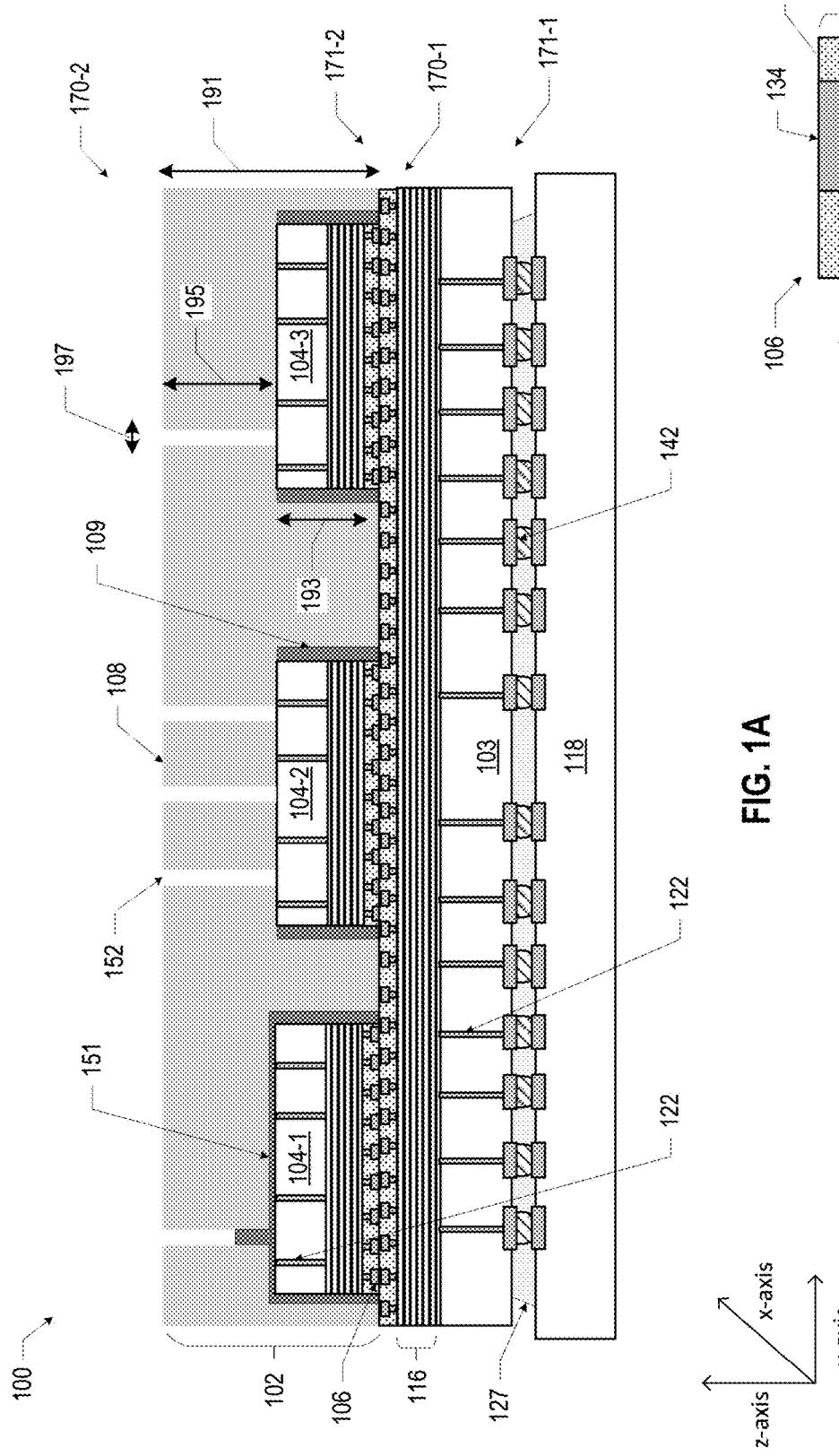
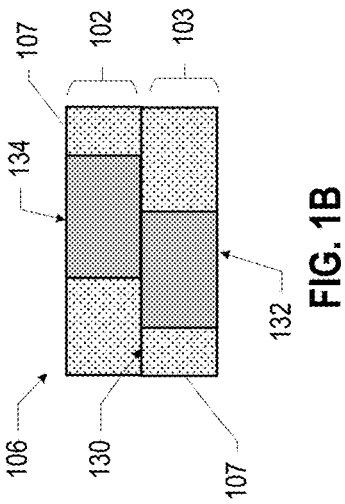
FIG. 1A
FIG. 1B

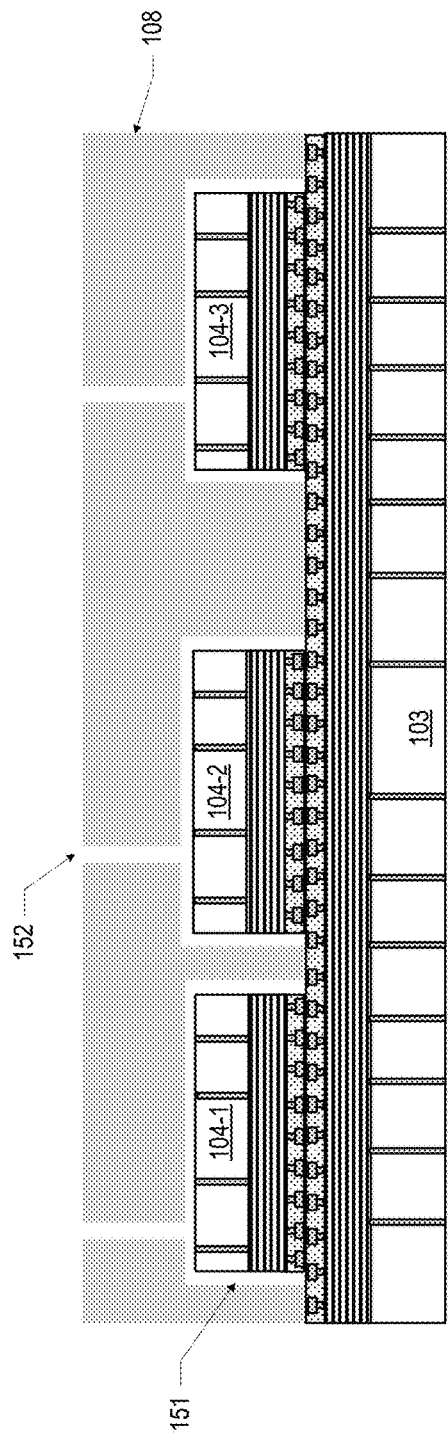
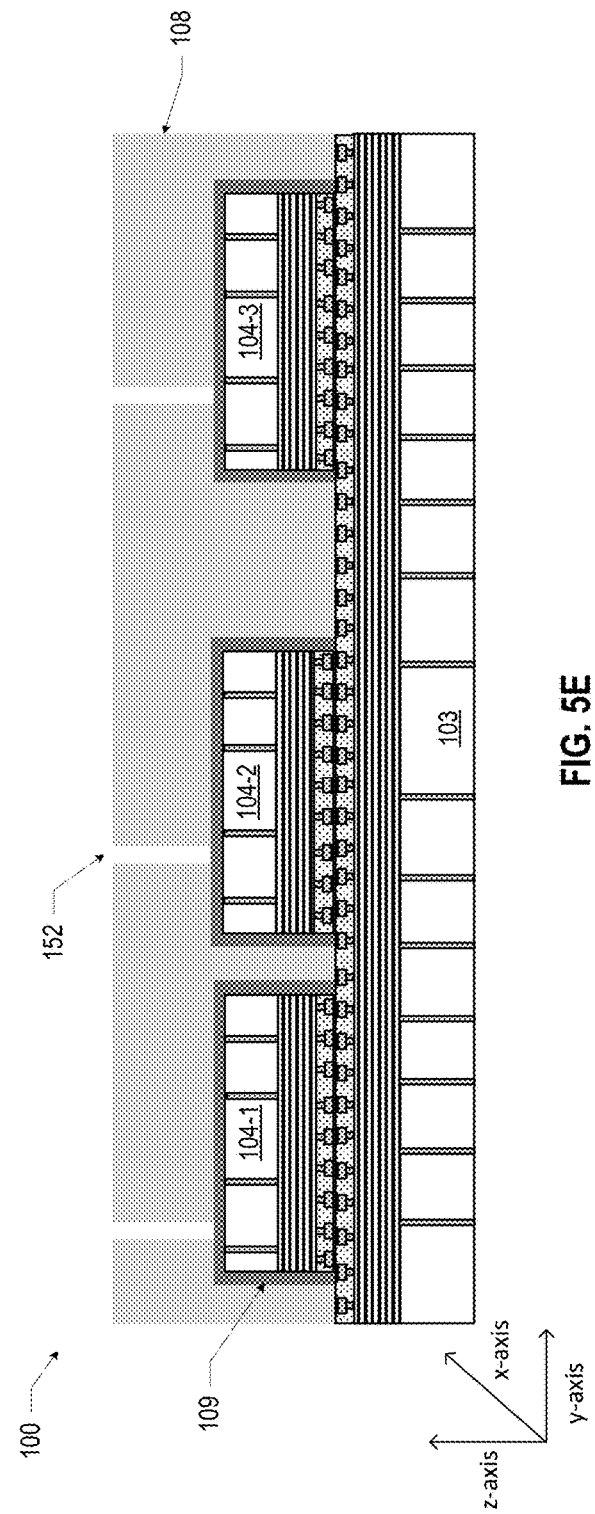
FIG. 5D
FIG. 5E

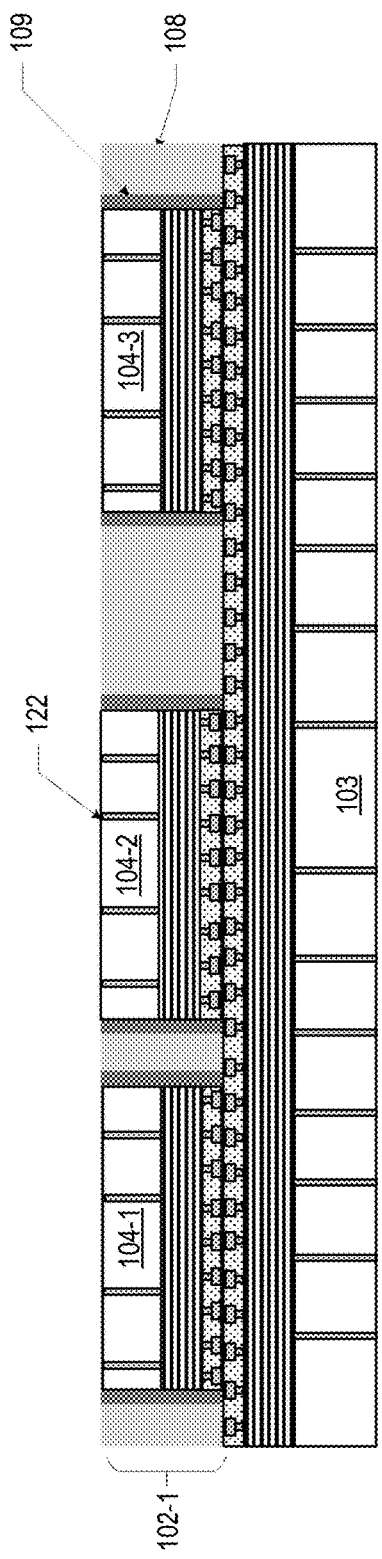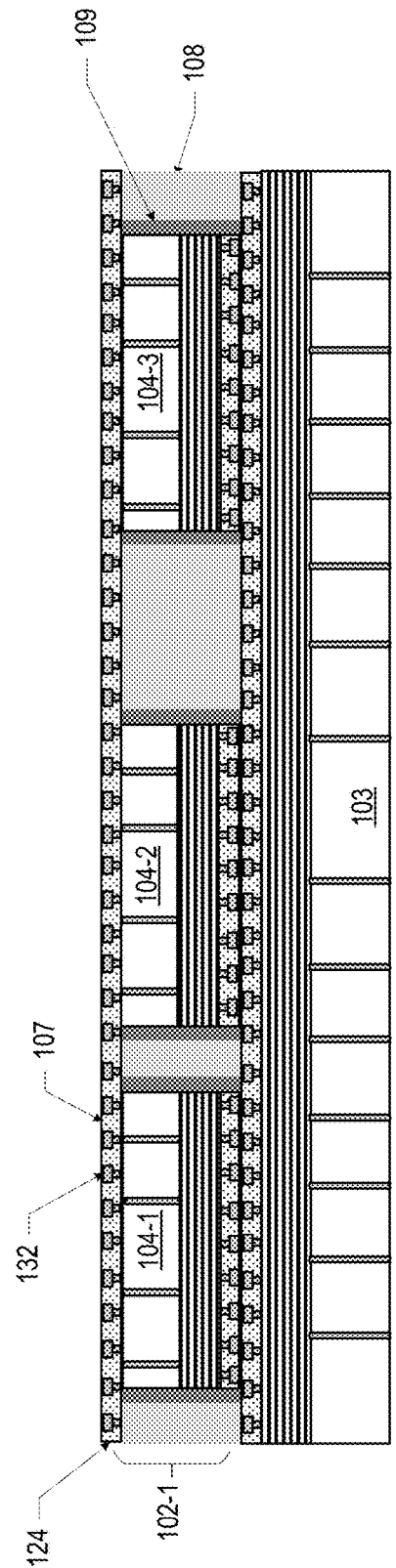

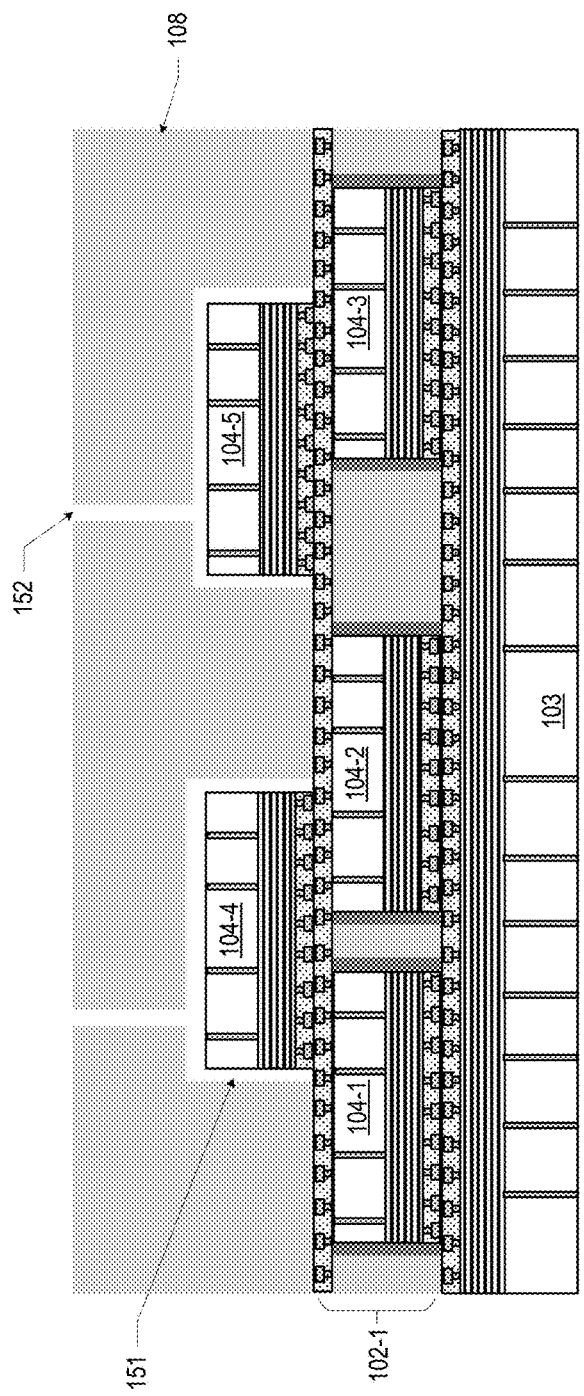
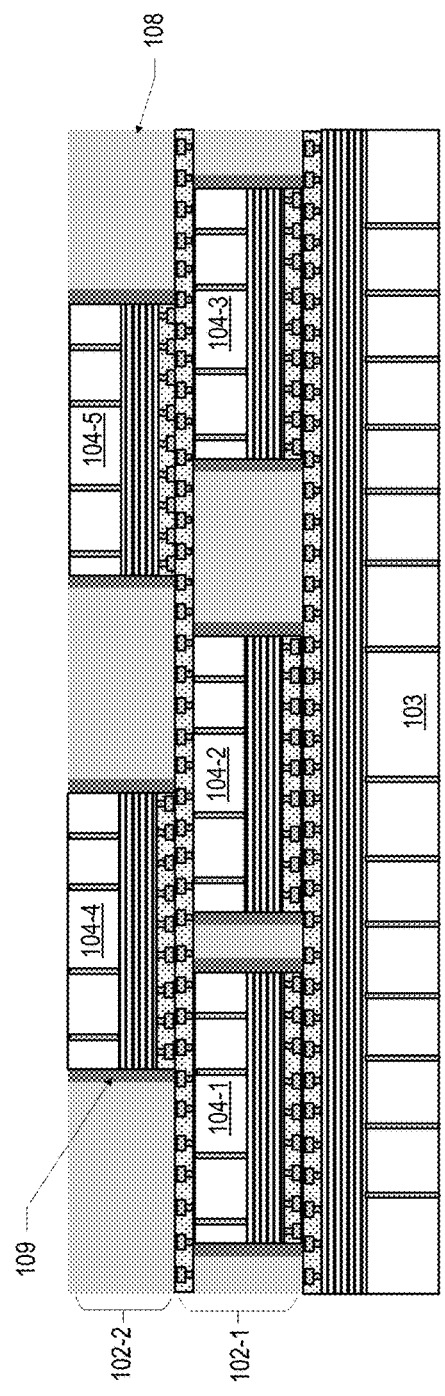
FIG. 5H
FIG. 5I

TEMPLATE STRUCTURE FOR QUASI-MONOLITHIC DIE ARCHITECTURES

TECHNICAL FIELD

The present disclosure relates to techniques, methods, and apparatus directed to quasi-monolithic die architecture in semiconductor integrated circuit (IC) packaging.

BACKGROUND

Electronic circuits when commonly fabricated on a wafer of semiconductor material, such as silicon, are called ICs. The wafer with such ICs is typically cut into numerous individual dies. The dies may be packaged into an IC package containing one or more dies along with other electronic components such as resistors, capacitors, and inductors. The IC package may be integrated onto an electronic system, such as a consumer electronic system. The dies in the IC package may be surrounded by a non-thermally conducting material that may increase a temperature of the dies during use and reduce IC package performance and reliability.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 1A is a schematic cross-sectional view of an example microelectronic assembly according to some embodiments of the present disclosure.

FIG. 1B is a schematic cross-sectional view of a portion of the example microelectronic assembly of FIG. 1A.

FIGS. 5A-5K are schematic cross-sectional views of different stages of an example process for manufacturing the microelectronic assembly of FIG. 1A according to some embodiments of the present disclosure.

DETAILED DESCRIPTION

Figure 2A:
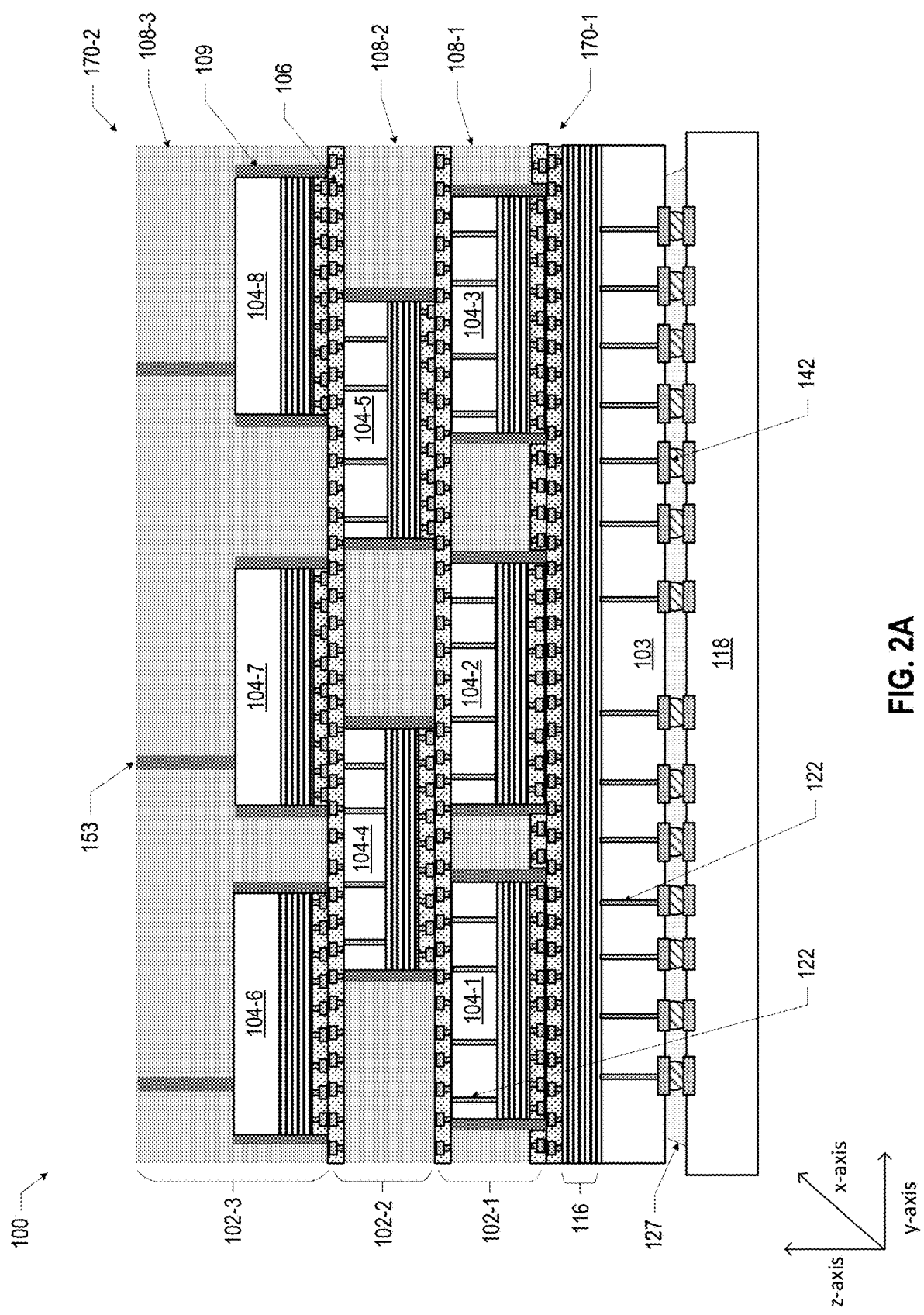
FIGS. 2A and 2B are schematic cross-sectional views of other example microelectronic assemblies according to some embodiments of the present disclosure.

For purposes of illustrating IC packages described herein, it is important to understand phenomena that may come into play during assembly and packaging of ICs. The following foundational information may be viewed as a basis from which the present disclosure may be properly explained. Such information is offered for purposes of explanation only and, accordingly, should not be construed in any way to limit the broad scope of the present disclosure and its potential applications.

Advances in semiconductor processing and logic design have permitted an increase in the amount of logic circuits that may be included in processors and other IC devices. As a result, many processors now have multiple cores that are monolithically integrated on a single die. Generally, these types of monolithic ICs are also described as planar since they take the form of a flat surface and are typically built on a single silicon wafer made from a monocrystalline silicon boule. The typical manufacturing process for such monolithic ICs is called a planar process, allowing photolithography, etching, heat diffusion, oxidation, and other such processes to occur on the surface of the wafer, such that active circuit elements (e.g., transistors and diodes) are formed on the planar surface of the silicon wafer.

Current technologies permit hundreds and thousands of such active circuit elements to be formed on a single die so that numerous logic circuits may be enabled thereon. In such monolithic dies, the manufacturing process must be optimized for all the circuits equally, resulting in trade-offs between different circuits. In addition, because of the limitation of having to place circuits on a planar surface, some circuits are farther apart from some others, resulting in decreased performance such as longer delays. The manufacturing yield may also be severely impacted because the entire die may have to be discarded if even one circuit is malfunctional.

One solution to overcome such negative impacts of monolithic dies is to disaggregate the circuits into smaller dies (e.g., chiplets, tiles) electrically coupled by interconnect bridges. The smaller dies are part of an assembly of interconnected dies that together form a complete IC in terms of application and/or functionality, such as a memory chip, microprocessor, microcontroller, commodity IC (e.g., chip used for repetitive processing routines, simple tasks, application specific IC, etc.), and system-on-a-chip (SoC). In other words, the individual dies are connected to create the functionalities of a monolithic IC. By using separate dies, each individual die can be designed and manufactured optimally for a particular functionality. For example, a processor core that contains logic circuits might aim for performance, and thus might require a very speed-optimized layout. This has different manufacturing requirements compared to a USB controller, which is built to meet certain universal serial bus (USB) standards, rather than for processing speed. Thus, by having different parts of the overall design separated into different dies, each one optimized in terms of design and manufacturing, the overall yield and cost of the combined die solution may be improved.

The connectivity between these dies is achievable by many ways. For example, in 2.5D packaging solutions, a silicon interposer and through-silicon vias (TSVs) connect dies at silicon interconnect speed in a minimal footprint. In another example, a silicon bridge embedded under the edges of two interconnecting dies facilitates electrical coupling between them. In a three-dimensional (3D) architecture, the dies are stacked one above the other, creating a smaller footprint overall. Typically, the electrical connectivity and mechanical coupling in such 3D architecture is achieved using TSVs and high pitch solder-based bumps (e.g., C2 interconnections).

One stacking method may comprise stacking and electrically attaching at least one relatively small dies to a relatively large die to form an IC package. The large die also may be referred to herein as a "base die." In one example, the large die may be configured to be attached to an electronic substrate or board and the at least one small die may be on top of the larger die. Extra space around the at least one small die may be "filled" with passive die-like structures, such as silicon structures, to function as thermomechanical structures, which may provide a thermal path for the larger die and may assist in maintaining the mechanical integrity of the IC package, as will be understood to those skilled in the art. The spaces between the at least one small die and the passive die-like structures is typically filled with mold or oxide material, which is less thermally conductive and more likely to inhibit heat conduction/dissipation. In another example, the extra space around the at least one small die may be "filled" with a dielectric material, such as silicon dioxide, that has embedded electrically conductive vias, called through-dielectric vias (TDV), within the dielectric material. The through-dielectric vias may provide electrical paths between the larger integrated circuit and an electronic substrate or board. However, the dielectric material has some limitations, such generally being poor thermal conductor and being relatively mechanically weak compared to the materials from which the large and small dies are formed, such as silicon. Thus, there is an on-going effort to improve the structure, reliability, and manufacturability of such stacked IC packages.

In one aspect of the present disclosure, an example of quasi-monolithic die architecture includes recursively coupling a plurality of IC dies to form microelectronic assemblies of a processing system. The plurality of IC dies may comprise active dies and/or passive dies, and at least a portion of the plurality of dies are coupled using high-density interconnects. As used herein, "high-density interconnects" include die-to-die (DTD) interconnects having a pitch of less than 10 microns. As used herein, pitch is measured center-to-center (e.g., from a center of an interconnect to a center of an adjacent interconnect).

Accordingly, microelectronic assemblies, related devices and methods, are disclosed herein. In some embodiments, a microelectronic assembly may include a first die having a surface; a template structure having a first surface and an opposing second surface, wherein the first surface of the template structure is coupled to the surface of the first die, and wherein the template structure includes a cavity at the first surface and a through-template opening extending from a top surface of the cavity to the second surface of the template structure; and a second die within the cavity of the template structure and electrically coupled to the surface of the first die by interconnects having a pitch of less than 10 microns between adjacent interconnects.

Each of the structures, assemblies, packages, methods, devices, and systems of the present disclosure may have several innovative aspects, no single one of which is solely responsible for all the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art.

The terms "circuit" and "circuitry" mean one or more passive and/or active electrical and/or electronic components that are arranged to cooperate with one another to provide a desired function. The terms also refer to analog circuitry, digital circuitry, hard wired circuitry, programmable circuitry, microcontroller circuitry and/or any other type of physical hardware electrical and/or electronic component.

The term "integrated circuit" means a circuit that is integrated into a monolithic semiconductor or analogous material.

In some embodiments, the IC dies disclosed herein may comprise substantially monocrystalline semiconductors, such as silicon or germanium, as a base material (e.g., substrate, body) on which integrated circuits are fabricated with traditional semiconductor processing methods. The semiconductor base material may include, for example, N-type pr P-type materials. Dies may include, for example, a crystalline base material formed using a bulk silicon (or other bulk semiconductor material) or a silicon-on-insulator (SOI) structure. In some other embodiments, the base material of one or more of the IC dies may comprise alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-N, group III-V, group II-VI, or group IV materials. In yet other embodiments, the base material may comprise compound semiconductors, for example, with a first sub-lattice of at least one element from group III of the periodic table (e.g., Al, Ga, In), and a second sub-lattice of at least one element of group V of the periodic table (e.g., P, As, Sb). In yet other embodiments, the base material may comprise an intrinsic IV or III-V semiconductor material or alloy, not intentionally doped with any electrically active impurity; in alternate embodiments, nominal impurity dopant levels may be present. In still other embodiments, dies may comprise a non-crystalline material, such as polymers; for example, the base material may comprise silica-filled epoxy. In other embodiments, the base material may comprise high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, the base material may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphide, and black phosphorus, each of which may possibly be doped with one or more of gallium, indium, aluminum, fluorine, boron, phosphorus, arsenic, nitrogen, tantalum, tungsten, and magnesium, etc. Although a few examples of the material for dies are described here, any material or structure that may serve as a foundation (e.g., base material) upon which IC circuits and structures as described herein may be built falls within the spirit and scope of the present disclosure.

Unless described otherwise, IC dies described herein include one or more IC structures (or, simply, "ICs") implementing (i.e., configured to perform) certain functionality. In one such example, the term "memory die" may be used to describe a die that includes one or more ICs implementing memory circuitry (e.g., ICs implementing one or more of memory devices, memory arrays, control logic configured to control the memory devices and arrays, etc.). In another such example, the term "compute die" may be used to describe a die that includes one or more ICs implementing logic/compute circuitry (e.g., ICs implementing one or more of I/O functions, arithmetic operations, pipelining of data, etc.).

In another example, the terms "package" and "IC package" are synonymous, as are the terms "die" and "IC die." Note that the terms "chip," "die," and "IC die" are used interchangeably herein.

The term "insulating" means "electrically insulating," the term "conducting" means "electrically conducting," unless otherwise specified. With reference to optical signals and/or devices, components and elements that operate on or using optical signals, the term "conducting" can also mean "optically conducting."

The terms "oxide," "carbide," "nitride," etc. refer to compounds containing, respectively, oxygen, carbon, nitrogen, etc.

The term "high-k dielectric" refers to a material having a higher dielectric constant than silicon oxide, while the term "low-k dielectric" refers to a material having a lower dielectric constant than silicon oxide.

The term "insulating material" or "insulator" (also called herein as "dielectric material" or "dielectric") refers to solid materials (and/or liquid materials that solidify after processing as described herein) that are substantially electrically nonconducting. They may include, as examples and not as limitations, organic polymers and plastics, and inorganic materials such as ionic crystals, porcelain, glass, silicon, silicon oxide, silicon carbide, silicon carbonitride, silicon nitride, and alumina or a combination thereof. They may include dielectric materials, high polarizability materials, and/or piezoelectric materials. A dielectric material may include any suitable dielectric material commonly used in semiconductor manufacture, such as silicon and one or more of oxygen, nitrogen, and carbon (e.g., in the form of silicon oxide, silicon nitride, silicon oxynitride, or silicon carbon nitride); a polyimide material; or a low-k or ultra low-k dielectric (e.g., carbon-doped dielectrics, fluorine-doped dielectrics, porous dielectrics, organic polymeric dielectrics, photo-imageable dielectrics, and/or benzocyclobutene-based polymers). They may be transparent or opaque without departing from the scope of the present disclosure. Further examples of insulating materials are underfills and molds or mold-like materials used in packaging applications, including for example, materials used in organic interposers, package supports and other such components.

In various embodiments, elements associated with an IC may include, for example, transistors, diodes, power sources, resistors, capacitors, inductors, sensors, transceivers, receivers, antennas, etc. In various embodiments, elements associated with an IC may include those that are monolithically integrated within an IC, mounted on an IC, or those connected to an IC. The ICs described herein may be either analog or digital and may be used in a number of applications, such as microprocessors, optoelectronics, logic blocks, audio amplifiers, etc., depending on the components associated with the IC. The ICs described herein may be employed in a single IC die or as part of a chipset for executing one or more related functions in a computer.

In various embodiments of the present disclosure, transistors described herein may be field-effect transistors (FETs), e.g., MOSFETs. In many embodiments, an FET is a four-terminal device. In silicon-on-insulator, or nanoribbon, or gate all-around (GAA) FET, the FET is a three-terminal device that includes source, drain, and gate terminals and uses electric field to control current flowing through the device. A FET typically includes a channel material, a source region and a drain regions provided in and/or over the channel material, and a gate stack that includes a gate electrode material, alternatively referred to as a "work function" material, provided over a portion of the channel material (the "channel portion") between the source and the drain regions, and optionally, also includes a gate dielectric material between the gate electrode material and the channel material.

In a general sense, an "interconnect" refers to any element that provides a physical connection between two other elements. For example, an electrical interconnect provides electrical connectivity between two electrical components, facilitating communication of electrical signals between them; an optical interconnect provides optical connectivity between two optical components, facilitating communication of optical signals between them. As used herein, both electrical interconnects and optical interconnects are comprised in the term "interconnect." The nature of the interconnect being described is to be understood herein with reference to the signal medium associated therewith. Thus, when used with reference to an electronic device, such as an IC that operates using electrical signals, the term "interconnect" describes any element formed of an electrically conductive material for providing electrical connectivity to one or more elements associated with the IC or/and between various such elements. In such cases, the term "interconnect" may refer to both conductive traces (also sometimes referred to as "lines," "wires," "metal lines" or "trenches") and conductive vias (also sometimes referred to as "vias" or "metal vias"). Sometimes, electrically conductive traces and vias may be referred to as "conductive traces" and "conductive vias", respectively, to highlight the fact that these elements include electrically conductive materials such as metals. Likewise, when used with reference to a device that operates on optical signals as well, such as a photonic IC (PIC), "interconnect" may also describe any element formed of a material that is optically conductive for providing optical connectivity to one or more elements associated with the PIC. In such cases, the term "interconnect" may refer to optical waveguides, including optical fiber, optical splitters, optical combiners, optical couplers, and optical vias.

The term "waveguide" refers to any structure that acts to guide the propagation of light from one location to another location typically through a substrate material such as silicon or glass. In various examples, waveguides can be formed from silicon, doped silicon, silicon nitride, glasses such as silica (e.g., silicon dioxide or $SiO_2$), borosilicate (e.g., 70-80 wt % $SiO_2$, 7-13 wt % of $B_2O_3$, 4-8 wt % $Na_2O$ or $K_2O$, and 2-8 wt % of $Al_2O_3$) and so forth. Waveguides may be formed using various techniques including but not limited to forming waveguides in situ. For example, in some embodiments, waveguides may be formed in situ in glass using low temperature glass-to-glass bonding or by laser direct writing. Waveguides formed in situ may have lower loss characteristics.

The term "conductive trace" may be used to describe an electrically conductive element isolated by an insulating material. Within IC dies, such insulating material comprises interlayer low-k dielectric that is provided within the IC die. Within package substrates, and printed circuit boards (PCBs) such insulating material comprises organic materials such as Ajinomoto Buildup Film (ABF), polyimides, or epoxy resin. Such conductive lines are typically arranged in several levels, or several layers, of metallization stacks.

The term "conductive via" may be used to describe an electrically conductive element that interconnects two or more conductive lines of different levels of a metallization stack. To that end, a via may be provided substantially perpendicularly to the plane of an IC die/chip or a support structure over which an IC structure is provided and may interconnect two conductive lines in adjacent levels or two conductive lines in non-adjacent levels.

The term "package substrate" may be used to describe any substrate material that facilitates the packaging together of any collection of semiconductor dies and/or other electrical components such as passive electrical components. As used herein, a package substrate may be formed of any material including, but not limited to, insulating materials such as resin impregnated glass fibers (e.g., PCB or Printed Wiring Boards (PWB)), glass, ceramic, silicon, silicon carbide, etc. In addition, as used herein, a package substrate may refer to a substrate that includes buildup layers (e.g., ABF layers).

The term "metallization stack" may be used to refer to a stack of one or more interconnects for providing connectivity to different circuit components of an IC die/chip and/or a package substrate.

As used herein, the term "pitch" of interconnects refers to a center-to-center distance between adjacent interconnects.

In context of a stack of dies coupled to one another or in context of a die coupled to a package substate, the term "interconnect" may also refer to, respectively, die-to-die (DTD) interconnects and die-to-package substrate (DTPS) interconnects. DTD interconnects may also be referred to as first-level interconnects (FLI). DTPS interconnects may also be referred to as Second-Level Interconnects (SLI).

Although not specifically shown in all of the present illustrations in order to not clutter the drawings, when DTD or DTPS interconnects are described, a surface of a first die may include a first set of conductive contacts, and a surface of a second die or a package substrate may include a second set of conductive contacts. One or more conductive contacts of the first set may then be electrically and mechanically coupled to some of the conductive contacts of the second set by the DTD or DTPS interconnects.

In some embodiments, the pitch of the DTD interconnects may be different from the pitch of the DTPS interconnects, although, in other embodiments, these pitches may be substantially the same.

The DTPS interconnects disclosed herein may take any suitable form. In some embodiments, a set of DTPS interconnects may include solder (e.g., solder bumps or balls that are subject to a thermal reflow to form the DTPS interconnects). DTPS interconnects that include solder may include any appropriate solder material, such as lead/tin, tin/bismuth, eutectic tin/silver, ternary tin/silver/copper, eutectic tin/copper, tin/nickel/copper, tin/bismuth/copper, tin/indium/copper, tin/zinc/indium/bismuth, or other alloys. In some embodiments, a set of DTPS interconnects may include an anisotropic conductive material, such as an anisotropic conductive film or an anisotropic conductive paste. An anisotropic conductive material may include conductive materials dispersed in a non-conductive material. In some embodiments, an anisotropic conductive material may include microscopic conductive particles embedded in a binder or a thermoset adhesive film (e.g., a thermoset biphenyl-type epoxy resin, or an acrylic-based material). In some embodiments, the conductive particles may include a polymer and/or one or more metals (e.g., nickel or gold). For example, the conductive particles may include nickel-coated gold or silver-coated copper that is in turn coated with a polymer. In another example, the conductive particles may include nickel. When an anisotropic conductive material is uncompressed, there may be no conductive pathway from one side of the material to the other. However, when the anisotropic conductive material is adequately compressed (e.g., by conductive contacts on either side of the anisotropic conductive material), the conductive materials near the region of compression may contact each other so as to form a conductive pathway from one side of the film to the other in the region of compression.

The DTD interconnects disclosed herein may take any suitable form. In some embodiments, some or all of the DTD interconnects in a microelectronic assembly or an IC package as described herein may be metal-to-metal interconnects (e.g., copper-to-copper interconnects, or plated interconnects). In such embodiments, the conductive contacts on either side of the DTD interconnect may be bonded together (e.g., under elevated pressure and/or temperature) without the use of intervening solder or an anisotropic conductive material. In some metal-to-metal interconnects, a dielectric material (e.g., silicon oxide, silicon nitride, silicon carbide) may be present between the metals bonded together (e.g., between copper pads or posts that provide the associated conductive contacts). In some embodiments, one side of a DTD interconnect may include a metal pillar (e.g., a copper pillar), and the other side of the DTD interconnect may include a metal contact (e.g., a copper contact) recessed in a dielectric. In some embodiments, a metal-to-metal interconnect (e.g., a copper-to-copper interconnect) may include a noble metal (e.g., gold) or a metal whose oxides are conductive (e.g., silver). In some embodiments, a metal-to-metal interconnect may include metal nanostructures (e.g., nanorods) that may have a reduced melting point. Metal-to-metal interconnects may be capable of reliably conducting a higher current than other types of interconnects; for example, some solder interconnects may form brittle intermetallic compounds when current flows, and the maximum current provided through such interconnects may be constrained to mitigate mechanical failure.

In some embodiments, the dies on either side of a set of DTD interconnects may be bare (e.g., unpackaged) dies.

In some embodiments, the DTD interconnects may include solder. For example, the DTD interconnects may include conductive bumps or pillars (e.g., copper bumps or pillars) attached to the respective conductive contacts by solder. In some embodiments, a thin cap of solder may be used in a metal-to-metal interconnect to accommodate planarity, and this solder may become an intermetallic compound during processing. In some embodiments, the solder used in some or all of the DTD interconnects may have a higher melting point than the solder included in some or all of the DTPS interconnects. For example, when the DTD interconnects in an IC package are formed before the DTPS interconnects are formed, solder-based DTD interconnects may use a higher-temperature solder (e.g., with a melting point above 200 degrees Celsius), while the DTPS interconnects may use a lower-temperature solder (e.g., with a melting point below 200 degrees Celsius). In some embodiments, a higher-temperature solder may include tin; tin and gold; or tin, silver, and copper (e.g., 96.5% tin, 3% silver, and 0.5% copper). In some embodiments, a lower-temperature solder may include tin and bismuth (e.g., eutectic tin bismuth), tin, silver, bismuth, indium, indium and tin, or gallium.

In some embodiments, a set of DTD interconnects may include an anisotropic conductive material, such as any of the materials discussed above for the DTPS interconnects. In some embodiments, the DTD interconnects may be used as data transfer lanes, while the DTPS interconnects may be used for power and ground lines, among others.

In microelectronic assemblies or IC packages as described herein, some or all of the DTD interconnects may have a finer pitch than the DTPS interconnects. In some embodiments, the DTPS interconnects disclosed herein may have a pitch between about 80 microns and 300 microns, while the DTD interconnects disclosed herein may have a pitch between about 0.5 microns and 100 microns, depending on the type of the DTD interconnects. An example of silicon-level interconnect density is provided by the density of some DTD interconnects. In some embodiments, the DTD interconnects may have too fine a pitch to couple to the package substrate directly (e.g., too fine to serve as DTPS interconnects). The DTD interconnects may have a smaller pitch than the DTPS interconnects due to the greater similarity of materials in the different dies on either side of a set of DTD interconnects than between a die and a package substrate on either side of a set of DTPS interconnects. In particular, the differences in the material composition of dies and package substrates may result in differential expansion and contraction of the die dies and package substrates due to heat generated during operation (as well as the heat applied during various manufacturing operations). To mitigate damage caused by this differential expansion and contraction (e.g., cracking, solder bridging, etc.), the DTPS interconnects in any of the microelectronic assemblies or IC packages as described herein may be formed larger and farther apart than DTD interconnects, which may experience less thermal stress due to the greater material similarity of the pair of dies on either side of the DTD interconnects.

It will be recognized that one more levels of underfill (e.g., organic polymer material such as benzotriazole, imidazole, polyimide, or epoxy) may be provided in an IC package described herein and may not be labeled in order to avoid cluttering the drawings. In various embodiments, the levels of underfill may comprise the same or different insulating materials. In some embodiments, the levels of underfill may comprise thermoset epoxies with silicon oxide particles; in some embodiments, the levels of underfill may comprise any suitable material that can perform underfill functions such as supporting the dies and reducing thermal stress on interconnects. In some embodiments, the choice of underfill material may be based on design considerations, such as form factor, size, stress, operating conditions, etc.; in other embodiments, the choice of underfill material may be based on material properties and processing conditions, such as cure temperature, glass transition temperature, viscosity and chemical resistance, among other factors; in some embodiments, the choice of underfill material may be based on both design and processing considerations.

In some embodiments, one or more levels of solder resist (e.g., epoxy liquid, liquid photoimageable polymers, dry film photoimageable polymers, acrylics, solvents) may be provided in an IC package described herein and may not be labeled or shown to avoid cluttering the drawings. Solder resist may be a liquid or dry film material including photoimageable polymers. In some embodiments, solder resist may be non-photoimageable.

The terms "substantially," "close," "approximately," "near," and "about," generally refer to being within +/−20% of a target value (e.g., within +/−5% or 10% of a target value) based on the context of a particular value as described herein or as known in the art.

Terms indicating orientation of various elements, e.g., "coplanar," "perpendicular," "orthogonal," "parallel," or any other angle between the elements, generally refer to being within +/−5%-20% of a target value based on the context of a particular value as described herein or as known in the art.

The term "connected" means a direct connection (which may be one or more of a mechanical, electrical, and/or thermal connection) between the things that are connected, without any intermediary devices, while the term "coupled" means either a direct connection between the things that are connected, or an indirect connection through one or more passive or active intermediary devices.

The description uses the phrases "in an embodiment" or "in embodiments," which may each refer to one or more of the same or different embodiments.

Furthermore, the terms "comprising," "including," "having," and the like, as used with respect to embodiments of the present disclosure, are synonymous.

The disclosure may use perspective-based descriptions such as "above," "below," "top," "bottom," and "side"; such descriptions are used to facilitate the discussion and are not intended to restrict the application of disclosed embodiments.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be "on" a second layer refers to a layer that is in direct contact with that second layer. Similarly, unless explicitly stated otherwise, one feature disposed between two features may be in direct contact with the adjacent features or may have one or more intervening layers.

The term "dispose" as used herein refers to position, location, placement, and/or arrangement rather than to any particular method of formation.

The term "between," when used with reference to measurement ranges, is inclusive of the ends of the measurement ranges.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). When used herein, the notation "A/B/C" means (A), (B), and/or (C).

Although certain elements may be referred to in the singular herein, such elements may include multiple sub-elements. For example, "an electrically conductive material" may include one or more electrically conductive materials. In another example, "a dielectric material" may include one or more dielectric materials.

Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

The accompanying drawings are not necessarily drawn to scale.

In the drawings, same reference numerals refer to the same or analogous elements/materials shown so that, unless stated otherwise, explanations of an element/material with a given reference numeral provided in context of one of the drawings are applicable to other drawings where element/materials with the same reference numerals may be illustrated. Further, the singular and plural forms of the labels may be used with reference numerals to denote a single one and multiple ones respectively of the same or analogous type, species, or class of element.

Furthermore, in the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using, e.g., images of suitable characterization tools such as scanning electron microscopy (SEM) images, transmission electron microscope (TEM) images, or non-contact profilometer. In such images of real structures, possible processing and/or surface defects could also be visible, e.g., surface roughness, curvature or profile deviation, pit or scratches, not-perfectly straight edges of materials, tapered vias or other openings, inadvertent rounding of corners or variations in thicknesses of different material layers, occasional screw, edge, or combination dislocations within the crystalline region(s), and/or occasional dislocation defects of single atoms or clusters of atoms. There may be other defects not listed here but that are common within the field of device fabrication and/or packaging.

Note that in the figures, various components (e.g., interconnects) are shown as aligned (e.g., at respective interfaces) merely for ease of illustration; in actuality, some or all of them may be misaligned. In addition, there may be other components, such as bond-pads, landing pads, metallization, etc. present in the assembly that are not shown in the figures to prevent cluttering. Further, the figures are intended to show relative arrangements of the components within their assemblies, and, in general, such assemblies may include other components that are not illustrated (e.g., various interfacial layers or various other components related to optical functionality, electrical connectivity, or thermal mitigation).

For example, in some further embodiments, the assembly as shown in the figures may include more dies along with other electrical components. Additionally, although some components of the assemblies are illustrated in the figures as being planar rectangles or formed of rectangular solids, this is simply for ease of illustration, and embodiments of these assemblies may be curved, rounded, or otherwise irregularly shaped as dictated by and sometimes inevitable due to the manufacturing processes used to fabricate various components.

In the drawings, a particular number and arrangement of structures and components are presented for illustrative purposes and any desired number or arrangement of such structures and components may be present in various embodiments.

Further, unless otherwise specified, the structures shown in the figures may take any suitable form or shape according to material properties, fabrication processes, and operating conditions.

For convenience, if a collection of drawings designated with different letters are present (e.g., FIGS. 1A-1C), such a collection may be referred to herein without the letters (e.g., as "FIG. 1"). Similarly, if a collection of reference numerals designated with different numerals or letters are present (e.g., 104-1, 104-2, 104-3), such a collection may be referred to herein without the numerals or letters (e.g., as "104").

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

FIG. 1A is a schematic cross-sectional view of an example microelectronic assembly 100 according to some embodiments of the present disclosure. Microelectronic assembly 100 comprises a layer 102 of IC dies 104 (e.g., 104-1, 104-2, 104-3) surrounded by a template structure 108 and coupled to a base die 103 by interconnects 106. In various embodiments, interconnects 106 may be FLI with a pitch of less than 10 micrometers between adjacent interconnects. An example of interconnect 106 in some embodiments is a hybrid bond, comprising metal-metal and dielectric-dielectric bonds. In the example shown in the figure, the number of layers 102 is one. In various other embodiments, microelectronic assembly 100 may include a plurality of layers 102, including two or more layers 102. In some embodiments, each layer 102 may comprise an interface layer on either side, the interface layer comprising the metal material and dielectric material of interconnects 106. The layer 102 may have a first surface 170-1 (e.g., a bottom surface) and an opposing second surface 170-2 (e.g., a top surface). The base die 103 may have a first surface 171-1 (e.g., a bottom surface) and an opposing second surface 171-2 (e.g., a top surface).

The template structure 108 may be coupled to the second surface 171-2 of the base die 103 and on and around the IC dies 104 (e.g., 104-1, 104-2, 104-3). In some embodiments, the template structure 108 may be coupled to the base die 103 by fusion bonding (i.e., dielectric-dielectric bonds with no metal-metal bonds at the interface, as shown in FIG. 1A). In some embodiments, the template structure 108 may be coupled to the base die 103 by diffusion bonding (e.g., metal-metal bonds across the interface, for example, using a surface layer of a soft metal, such as gold or silver, on the bonding surfaces of the template structure 108 and the base die 103, not shown). In some embodiments, the template structure 108 may be coupled to the base die 103 by hybrid bonding (e.g., interconnects 106). The template structure 108 may include a plurality of cavities 151 at the first surface 170-1 and a plurality of through-template openings 152 (e.g., air gaps). Individual ones of the plurality of through-template openings 152 extend from individual ones of top surfaces of the plurality of cavities 151 to the second surface 170-2 of the template structure 108. IC dies 104 (e.g., 104-1, 104-2, 104-3) may include a bottom surface (e.g., a surface towards the first surface 170-1), an opposing top surface (e.g., a surface towards the second surface 170-2), and lateral surfaces extending between the bottom and top surfaces (e.g., side surfaces). IC dies 104 (e.g., 104-1, 104-2, 104-3) may be nested within individual cavities 151 of the template structure 108 such that the template structure is on and around IC dies 104 ((e.g., 104-1, 104-2, 104-3). In some embodiments, a template structure 108 may be coupled to a top surface of IC dies 104 by any of the techniques described above (e.g., by fusion bonding, by diffusion bonding, or by hybrid bonding). The template structure 108 may include a structurally stiff and thermally conductive material, including one or more of silicon, aluminum and nitrogen (e.g., in the form of aluminum nitride), a ceramic, and a metal, such as copper, that may provide mechanical support and stability to the layer 102. In some embodiments, the template structure 108 may include a wafer of silicon with cavities 151, formed in a bottom surface, that fit over IC dies 104 and through-template openings 152 extending from top surfaces of the cavities to the second surface 170-2 of the template structure. A cavity 151 in a template structure 108 may include any suitable number of through-template openings 152 including one (e.g., as shown for IC dies 104-1, 104-3) or more than one (e.g., as shown for IC die 104-2). A template structure 108 may have any suitable dimensions. In some embodiments, a template structure 108 may have an overall thickness 191 between 70 microns and 800 microns. In some embodiments, a cavity may have a thickness 193 between 20 microns and 45 microns. In some embodiments, a through-template opening 152 may have a thickness 195 between 25 microns and 780 microns, and a diameter 197 (e.g., a cross-section or xy-dimension) between 10 microns and 1000 microns.

In some embodiments, a fill material 109 may be deposited between lateral surfaces of IC dies 104 and a template structure 108. A fill material 109 may include any suitable thermally conductive material, including an oxide material, such as silicon and oxygen (e.g., in the form of silicon oxide), glass, a thermal interface material (TIM), a capillary underfill material, an inorganic dielectric, an epoxy, solder, a metal, or a polymer having conductive particles. The fill material 109 may have any suitable dimensions, for example, a fill material may have a width (e.g., y-dimension) between 2 microns and 10 microns. In some embodiments, a fill material 109 may be deposited on a top surface of IC dies 104 (e.g., as shown for IC die 104-1) and/or may extend at least partially into a through-template opening 152 (e.g., as shown for the through-template opening 152 of IC die 104-1).

In some embodiments (as shown), a base die 103 and one or more IC dies 104 (e.g., 104-1, 104-2, 104-3) in layer 102, may include TSVs 122. In some embodiments, IC dies 104 in a top or final layer 102 may not include TSVs 122 (e.g., as shown in FIG. 2A for IC dies 104-6, 104-7, 104-8 in layer 102-3). TSVs 122 may be configured to carry power, signals and/or ground connection between a package substrate 118, the base die 103, and IC dies 104 in the layer 102. In various embodiments, a base die 103 and one or more IC die 104 in microelectronic assembly 100 may include different kinds of conductive traces, such as conductive traces configured to carry power and conductive traces configured to carry signals, having different dimensions (e.g., conductive traces configured to carry power may, in general, be larger (e.g., thicker, wider) than conductive traces configured to carry signals). Conductive traces may be present in a metallization stack 116 having a plurality of metal layers through insulator fabricated using known semiconductor manufacturing processes. In some embodiments, the insulator material in the metallization stacks may be a dielectric material.

In the example embodiment shown in the figure, the metallization stacks 116 of the base die 103 and IC dies 104 are face-to-face (e.g., metallization stack 116 of base die 103 faces and is coupled to the metallization stacks 116 of IC dies 104 (e.g., 104-1, 104-2, 104-3). In other embodiments, the metallization stack 116 of the base die 103 and IC dies 104 are face-to-back (not shown) (e.g., the metallization stack 116 of the base die 103 may face away from the metallization stacks 116 of the IC dies 104-1, 104-2, 104-3, such that the IC dies 104 are coupled to the TSVs 122 of the base die 103).

IC dies 104 may include any circuitry to perform any desired functionality and may be passive or active. For example, one or more of IC dies 104 may be interposer dies (e.g., bridge dies), memory dies (e.g., HBM), voltage regulator dies, or processor dies. In some embodiments, an IC die 104 may include a plurality of stacked dies (e.g., stacked memory dies).

FIG. 1B is a schematic cross-sectional view of a detail of a particular one of interconnects 106 in microelectronic assembly 100. Note that although only interconnect 106 is shown, the same structure and description may apply to any other such interconnects comprising hybrid bonds in microelectronic assembly 100 where applicable. In a general sense, interconnect 106 may include, at an interface 130 between the base die 103 and layer 102, metal-metal bonds between bond-pad 132 of base die 103 and bond-pad 134 of layer 102, and dielectric-dielectric bonds (e.g., oxide-oxide bonds) in a dielectric material 107 of the base die 103 and layer 102. In some embodiments, the structures as illustrated in the figure may be present in an interface layer between the base die 103 and layer 102, not shown. In other embodiments, the structures as illustrated in the figure may be present in IC dies 104 of the respective layers. In yet other embodiments, some structures as illustrated in the figure may be present in IC dies 104 of one of the layers, and other structures may be present outside/around IC dies 104 of the other one of the layers. Bond-pad 132 of the base die 103 may bond with bond-pad 134 of layer 102. Dielectric material 107 (e.g., silicon oxide, silicon nitride, silicon oxynitride, etc.) in base die 103 and layer 102 may bond with each other. The bonded metal and dielectric materials form interconnect 106, comprising hybrid bonds, providing electrical and mechanical coupling between the base die 103 and layer 102. In various embodiments, interconnects 106 may have a linear dimension of less than 5 micrometers and a pitch of less than 10 micrometers between adjacent interconnects.

Turning back to FIG. 1A, package substrate 118 may include conductive pathways (not shown) through an organic dielectric material. The conductive pathways may include conductive traces coupled by conductive vias. The package substrate 118 may further include bond-pads, redistribution layers, substrate cores, passive components and other elements, which are not shown merely for ease of illustration and not as limitations. Package substrate 118 may be coupled to the first surface 171-1 of the base layer by SLIs 142 (e.g., DTPS interconnects, such as flip-chip solder bonds). In various embodiments, SLI 142 may have a pitch greater than 10 micrometers between adjacent interconnects. An underfill material 127 may be disposed around SLIs 142. The underfill process may include dispensing underfill material in liquid form, allowing the material to flow and fill interstitial gaps around SLIs 142, and subjecting the assembly to a curing process, such as baking, to solidify the material.

FIG. 2A is a schematic cross-sectional view of another example microelectronic assembly according to some embodiments of the present disclosure. The configuration of the embodiment shown in the figure is like that of FIG. 1A, except for differences as described further. The configuration of microelectronic assembly 100 as described herein is a quasi-monolithic package architecture including a template structure. Microelectronic assembly 100 includes a plurality of layers 102 (e.g., 102-1, 102-2, and 102-3) of IC dies 104 (e.g., 104-1, 104-2, 104-3, 104-4, 104-5, 104-6, 104-7, 104-8), each layer 102 coupled to adjacent layers 102 by interconnects 106, each layer 102 of IC dies 104 surrounded by a template structure 108, and IC dies 104 (e.g., 104-1, 104-2, 104-3) of layer 102-1 coupled to a base die 103 by interconnects 106. In the example shown in the figure, the number of layers 102 is three: a first layer 102-1, a second layer 102-2, and a third layer 102-3. The plurality of layers 102 may have a first surface 170-1 (e.g., a bottom surface) and an opposing second surface 170-2 (e.g., a top surface). In particular, the microelectronic assembly 100 may include a first layer 102-1 having IC dies 102-1, 102-2, 102-3 coupled to a base die 103 by interconnects 106 and surrounded by a first template structure 108-1, a second layer 102-2 having IC dies 104-4, 104-5 surrounded by a second template structure 108-2, and a third layer 102-3 having IC dies 104-6, 104-7, 104-8 surrounded by a third template structure 108-3. The third template structure 108-3 (e.g., of the final layer or topmost layer nearest the second surface 170-2) may include a plurality of cavities and a plurality of through-template vias (TTVs) 153, where individual ones of the plurality of the TTVs 153 extend from individual ones of top surfaces of the plurality of cavities 151 to the second surface 170-2 of the third template structure 108-3. The TTVs 153 may include a thermally conductive material, for example, a capillary underfill material with conductive fillers, an epoxy with conductive fillers, solder, a metal, or a polymer having conductive particles. In some embodiments, a material of the TTVs 153 and a fill material 109 are a same material.

Figure 2B:
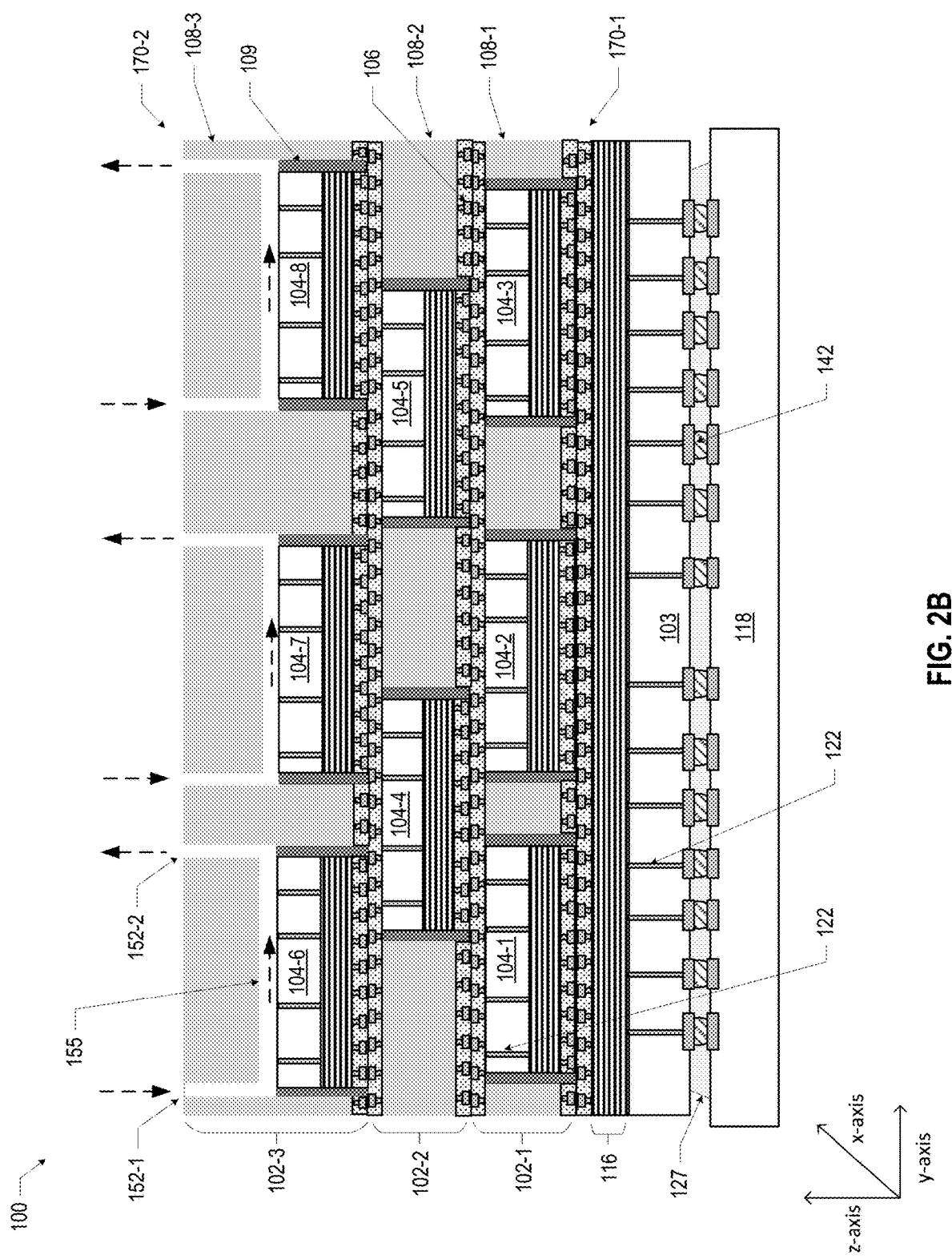

FIG. 2B is a schematic cross-sectional view of another example microelectronic assembly according to some embodiments of the present disclosure. The configuration of the embodiment shown in the figure is like that of FIGS. 1A and 2A, except for differences as described further. Microelectronic assembly 100 includes a plurality of layers 102 (e.g., 102-1, 102-2, and 102-3) of IC dies 104 (e.g., 104-1, 104-2, 104-3, 104-4, 104-5, 104-6, 104-7, 104-8), each layer 102 coupled to adjacent layers 102 by interconnects 106, each layer 102 of IC dies 104 surrounded by a template structure 108, the template structure 108 (e.g., 108-1, 108-2, 108-3) in each layer coupled to adjacent layers 102 by interconnects 106, and IC dies 104 (e.g., 104-1, 104-2, 104-3) of layer 102-1 coupled to a base die 103 by interconnects 106. In the example shown in the figure, the third template structure 108-3 (e.g., of the final layer or topmost layer nearest the second surface 170-2) may include a plurality of cavities, a plurality of through-template openings 152, where individual ones of the plurality of the through-template openings 152 extend from individual ones of top surfaces of the plurality of cavities 151 to the second surface 170-2 of the third template structure 108-3, and a fluidic cooling channel 155. The fluidic cooling channel 155 may be a hollow structure through the template structure 108-3 filled with a fluid or may be a space between a top of IC die 104-6, 104-7, 104-8 and the template structure 108-3 (e.g., as shown in FIG. 2B). During operation, a fluid may enter via a fluid inlet (e.g., a first through-template opening 152-1) may flow through the one or more channels 155, and may exit via a fluid outlet (e.g., a second through-template opening 152-2). The fluid may be circulated through the system via the fluidic cooling channel 155 and through-template openings 152 using a pump or a fan, which may be a separate piece of equipment or may be part of a cooling device. The microelectronic assembly 100 may further include pipes or connections to a heat exchanger, a chiller, or other device for cooling the fluid (not shown) before returning the fluid to the fluid inlet. The fluid may be any suitable liquid or gas, such as a coolant (e.g., water, fluorochemical liquids, silicone oil, ethylene glycol water, poly-alpha-olefin, or silicate ester), or helium, argon, or nitrogen, that may be circulated, usually by a pump or a fan (not shown), to dissipate heat more efficiently from IC die 104 (e.g., 104-6, 104-7, 104-8). The fluid may also include additives to prevent corrosion of the different components or to allow operation at higher/lower temperatures (e.g., additives to water to decrease its freezing point or increase its boiling point). The coolant used may depend on the coolant's properties, including viscosity and heat capacity, circulation flow rate, and the temperature rise during device operation. In some embodiments, the fluid may be an electronic coolant liquid or a dielectric fluid that is electrically insulating, highly thermally stable, non-toxic, chemically inert, non-corrosive with high thermal conductivity, such that the liquid may be in direct contact with IC die 104. A dielectric fluid may include a dielectric material in a liquid state. For example, the fluid may be an ultra-low-viscosity dielectric heat transfer fluid that includes synthetic hydrocarbon oils. In some embodiments, the fluid may not include sulfur. In some embodiments, the fluid may include a transformer oil, perfluoroalkanes, and purified water.

Figure 3:
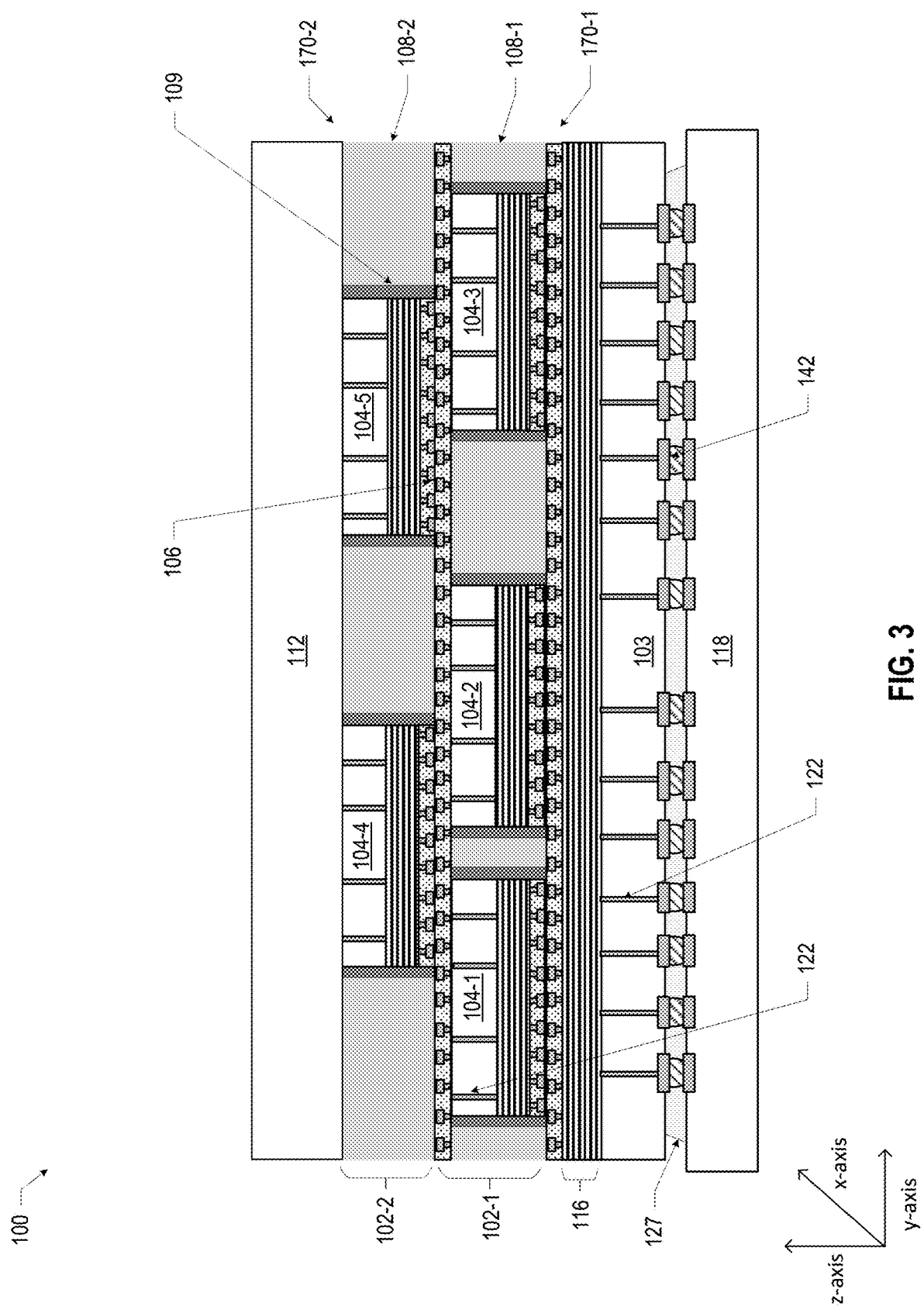
FIG. 3 is a schematic cross-sectional view of yet another example microelectronic assembly according to some embodiments of the present disclosure.

FIG. 3 is a schematic cross-sectional view of another example microelectronic assembly according to some embodiments of the present disclosure. The configuration of the embodiment shown in the figure is like that of FIG. 1A, except for differences as described further. Microelectronic assembly 100 includes a plurality of layers 102 (e.g., 102-1, 102-2) of IC dies 104 (e.g., 104-1, 104-2, 104-3, 104-4, 104-5), each layer 102 coupled to adjacent layers 102 by interconnects 106, each layer 102 of IC dies 104 surrounded by a template structure 108 (e.g., 108-1, 108-2), and IC dies 104 (e.g., 104-1, 104-2, 104-3) of layer 102-1 coupled to a base die 103 by interconnects 106. The template structure 108-2 of the final layer 102-2 has been planarized such that a top surface (e.g., a second surface 170-2) of the template structure 108-2 is planar with a top surface (e.g., a second surface 170-2) of IC dies 104-4, 104-5. A microelectronic assembly 100 further includes a substrate 112 coupled to a second surface 170-2 of the plurality of layers 102 (e.g., a top surface of layer 102-2). In some embodiments, the substrate 112 may comprise a structurally stiff and thermally conductive base, such as silicon, that may provide mechanical support and stability to the plurality of layers 102. In various embodiments, the substrate 112 may comprise a wafer of silicon cut to suitable proportions to fit over layers 102. The substrate 112 may be coupled to the second surface 170-2 of the layer 102-2 by fusion bonding, by diffusion bonding, or by hybrid bonding (e.g., interconnects 106). A substrate 112 may have any suitable dimensions, for example, a thickness (e.g., z-height) of the substrate 112 may be between 50 microns and 800 microns.

Figure 4:
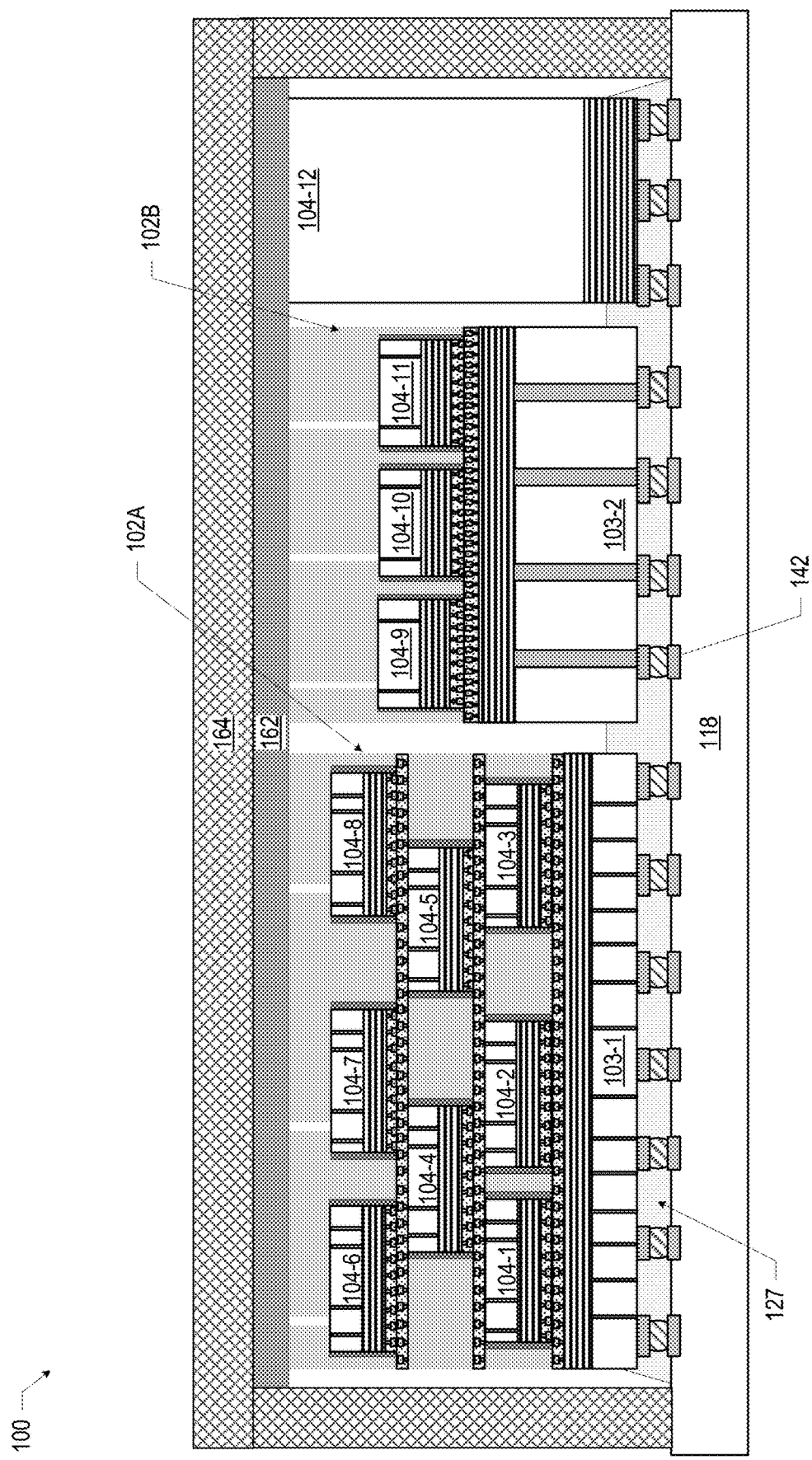
FIG. 4 is a schematic cross-sectional view of yet another example microelectronic assembly according to some embodiments of the present disclosure.

FIG. 4 is a schematic cross-sectional view of another example microelectronic assembly according to some embodiments of the present disclosure. The configuration of the embodiment shown in the figure is like that of FIGS. 1A and 2, except for differences as described further. A microelectronic assembly 100 may include one or more plurality of layers 102 of IC dies 104 surrounded by a template structure 108 and coupled to a base die 103 by interconnects 106 (e.g., a first plurality of layers 102A (e.g., 102-1, 102-2, 102-3) of IC dies 104 (e.g., 104-1, 104-2, 104-3, 104-4, 104-5, 104-6, 104-7, 104-8) coupled to a base die 103-1, similar to FIG. 2A, and a second plurality of layers 10213 (e.g., 102) of IC dies (e.g., 104-9, 104-10, 104-11) coupled to a base die 103-2, similar to FIG. 1A. The base dies 103 (e.g., 103-1, 103-2) and IC die 104-12 may be coupled to a package substrate 118 by SLIs 142. A microelectronic assembly 100 may further include a heat spreader 164 to move heat away from IC dies 104 (e.g., so that the heat may be more readily dissipated by a heat sink or other thermal management device). The heat spreader 164 may include any suitable thermally conductive material (e.g., metal, appropriate ceramics, etc.), and may include any suitable features (e.g., fins). In some embodiments, the heat spreader 164 may be an integrated heat spreader.

The microelectronic assembly 100 also may include a thermal interface material (TIM) 162 between a top surface of the plurality of layers 102 and IC die 104-12, and the heat spreader 164. The TIM 162 may include a thermally conductive material (e.g., metal particles) in a polymer or other binder. The TIM 162 may be a thermal interface material paste or a thermally conductive epoxy (which may be a fluid when applied and may harden upon curing, as known in the art). The TIM 162 may include a solder TIM. The TIM 162 may provide a path for heat generated by IC dies 104 to readily flow to the heat spreader 164, where it may be spread and/or dissipated.

Any suitable techniques may be used to manufacture the microelectronic assemblies 100 disclosed herein. For example, FIGS. 5A-5K are side, cross-sectional views of various stages in an example process for manufacturing the microelectronic assembly 100, in accordance with various embodiments. Although the operations discussed below with reference to FIGS. 5A-5K (and others of the accompanying drawings representing manufacturing processes) are illustrated in a particular order, these operations may be performed in any suitable order. Further, additional operations which are not illustrated may also be performed without departing from the scope of the present disclosure. Also, various ones of the operations discussed herein with respect to FIGS. 5A-5K may be modified in accordance with the present disclosure to fabricate others of microelectronic assembly 100 disclosed herein.

Figure 5A:
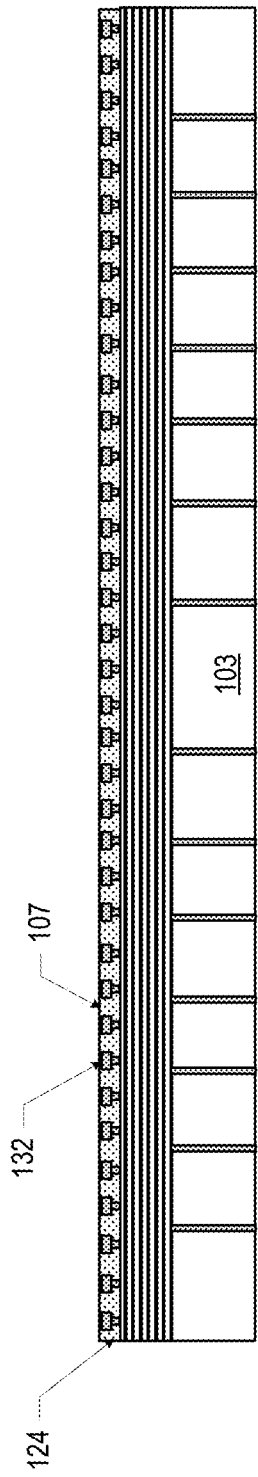

FIG. 5A illustrates a base die 103 including a bonding layer 124 on a top surface. The bonding layer 124 may include bond-pads 132 in a dielectric material 107, as described above with reference to FIG. 18. The bond-pads 132 may correspond to bond-pads 134 for forming hybrid direct bonds (e.g., interconnects 106 as shown in FIG. 5B).

Figure 5B:
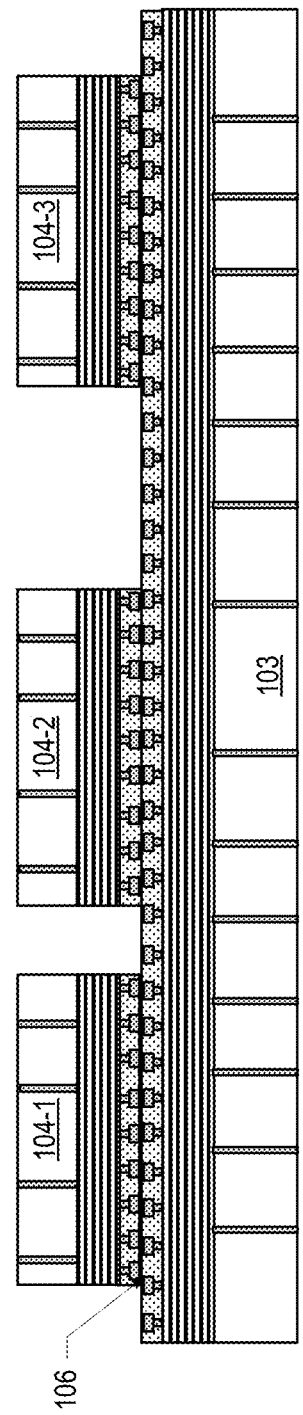

FIG. 5B illustrates an assembly subsequent to mounting IC dies 104-1, 104-2, 104-3, which may include TSVs 122, on the top surface of the base die 103 and forming interconnects 106. Any suitable method may be used to place IC dies 104, for example, automated pick-and-place. The assembly of FIG. 5B may be subjected to appropriate bonding processing to form interconnects 106. For example, the bonding process may include applying a suitable pressure and heating to a suitable temperature (e.g., to moderately high temperatures, e.g., between about 50 and 400 degrees Celsius) for a duration of time.

Figure 5C:
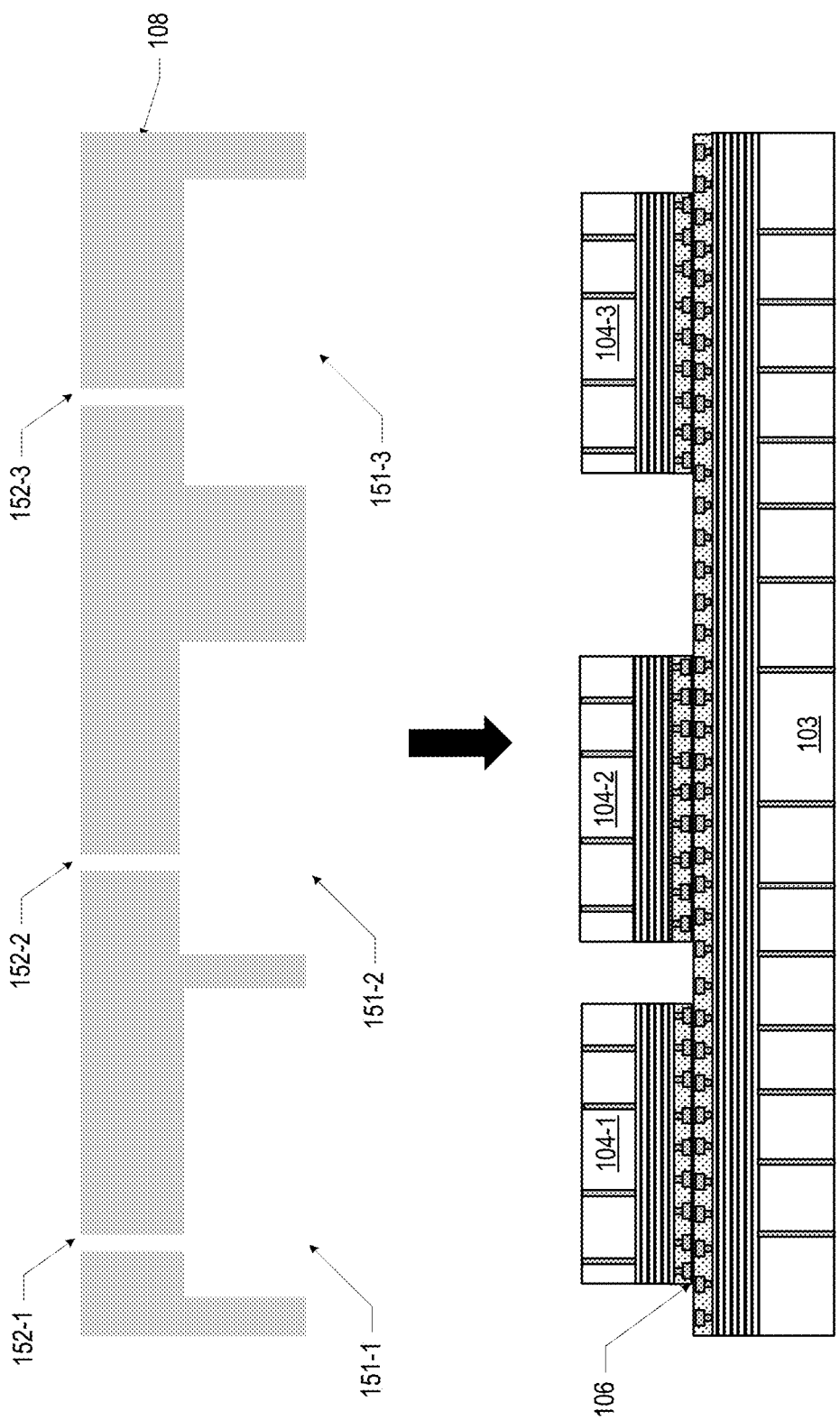

FIG. 5C illustrates a template structure 108 being placed on the assembly of FIG. 5B. A template structure 108 may include cavities 151 (e.g., 151-1, 151-2, 151-3) that correspond to IC dies 104 (e.g., 104-1, 104-2, 104-3) and through-template openings 152 (e.g., 152-1, 152-2, 153-3) that extend from a top surface of the individual cavities 151 to a top surface of the template structure 108. The cavities 151 and through-template openings 152 may be formed using any suitable technique, including, for example, machining, milling, or plasma etching. In some embodiments, the template structure 108 may include fluidic cooling channels (e.g., the fluidic cooling channels 155 of FIG. 2B).

FIG. 5D illustrates an assembly subsequent to coupling the template structure 108 to the assembly of FIG. 5B. In some embodiments, the template structure 108 may be coupled to the base die 103 as well as to IC dies 104. In some embodiments, the template structure 108 may be coupled to only the base die 103. In some embodiments, spaces or air gaps may be present between the template structure 108 and the lateral surface and/or top surfaces of IC dies 104. The through-template openings 152 may help minimize air getting trapped between the template structure 108 and the surfaces of IC dies 104, which may interfere with the coupling process. The template structure 108 may be coupled to the assembly of FIG. 5B using any suitable technique. For example, the template structure 108 may include a bonding layer on a bottom surface (e.g., a bonding layer including bond-pads 134 in a dielectric material 107, as described above with reference to FIG. 1B) for forming hybrid bonds (e.g., interconnects 106) with the bonding layer 124 on a top surface of the base die 103. In some embodiments, a bonding layer (e.g., similar to the bonding layer 124 on the base die 103) may be deposited on a top surface of IC dies 104 for coupling the template structure 108 to the IC dies 104 by hybrid bonding. In another example, the template structure 108 may be fusion bonded to the base die 103 and, optionally, IC dies 104. Forming the fusion bonds may include planarizing (e.g., using atomic layer deposition (ALD)) the bonding surfaces of the template structure and the dies (e.g., 103, 104) and depositing a fusion bonding material, such as silicon oxide, before forming the fusion bonds. In yet another example, the template structure 108 may be metal-metal diffusion bonded to the base die 103 and, optionally, IC dies 104. Forming the diffusion bonds may include depositing a metal material, such as gold or silver, include the bonding surfaces of the template structure and the dies (e.g., 103, 104), before forming the diffusion bonds.

FIG. 5E illustrates an assembly subsequent to depositing a fill material 109 in the spaces between the template structure 108 and the lateral surfaces of IC dies 104. In some embodiments, a fill material 109 may be deposited on the top surfaces of IC dies 104 as well. In some embodiments, the fill material 109 may be omitted. The fill material 109 may be deposited using any suitable technique, including capillary underfill, high pressure molten solder, or may be pre-dispensed prior to attaching the template structure 108. The assembly of FIG. 5E may itself be a microelectronic assembly 100 (e.g., similar to the microelectronic assembly 100 of FIG. 1A). Further operations may be performed on the assembly of FIG. 5E, for example, forming TTVs 153 by depositing a thermally conductive material in the through-template openings 152, performing finishing operations on the bottom surface of the base die 103, or performing the operations as described below with reference to FIGS. 5F-5K. In some embodiments, a thickness (e.g., a z-height) of the template structure may be reduced by removing material from a top portion of the template structure 108.

FIG. 5F illustrates an assembly subsequent to forming layer 102-1 by planarizing a top surface of the assembly of FIG. 5E to remove a portion of the template structure 108 and expose TSVs 122 in IC dies. The portion of the template structure 108 may be removed using any suitable technique, such as grinding or etching, and subsequently by chemical mechanical polishing (CMP).

FIG. 5G illustrates an assembly subsequent to forming a bonding layer 124 on a top surface to the assembly of FIG. 5F. The bonding layer 124 may include bond-pads 132 in a dielectric material 107, as described above with reference to FIG. 1B, for forming hybrid direct bonds (e.g., interconnects 106 as shown in FIG. 5H).

FIG. 5H illustrates an assembly subsequent to mounting IC dies 104-4, 104-5, forming interconnects 106, and coupling a template structure 108 to a top surface of the assembly of 5G. Any suitable method may be used to place IC dies 104, to form interconnects 106, and to couple the template structure 108, including the methods described above with reference to FIGS. 5B-5D.

FIG. 5I illustrates an assembly subsequent to depositing a fill material 109 in the spaces between the template structure 108 and the lateral surfaces of IC dies 104, and forming layer 102-2 by planarizing a top surface of the assembly to remove a portion of the template structure 108 and expose TSVs 122 in IC dies 104. Any suitable methods may be used to deposit the fill material 109 and remove the portion of the template structure 108, including the methods described above with reference to FIGS. 5E and 5F. Further operations may be performed on the assembly of FIG. 5I, including, for example, coupling a substrate 112 to a top surface of the assembly and performing finishing operations on the bottom surface of the base die 103, similar to the microelectronic assembly of FIG. 3, or performing the operations described below with reference to FIGS. 5H-5K.

Figure 5J:
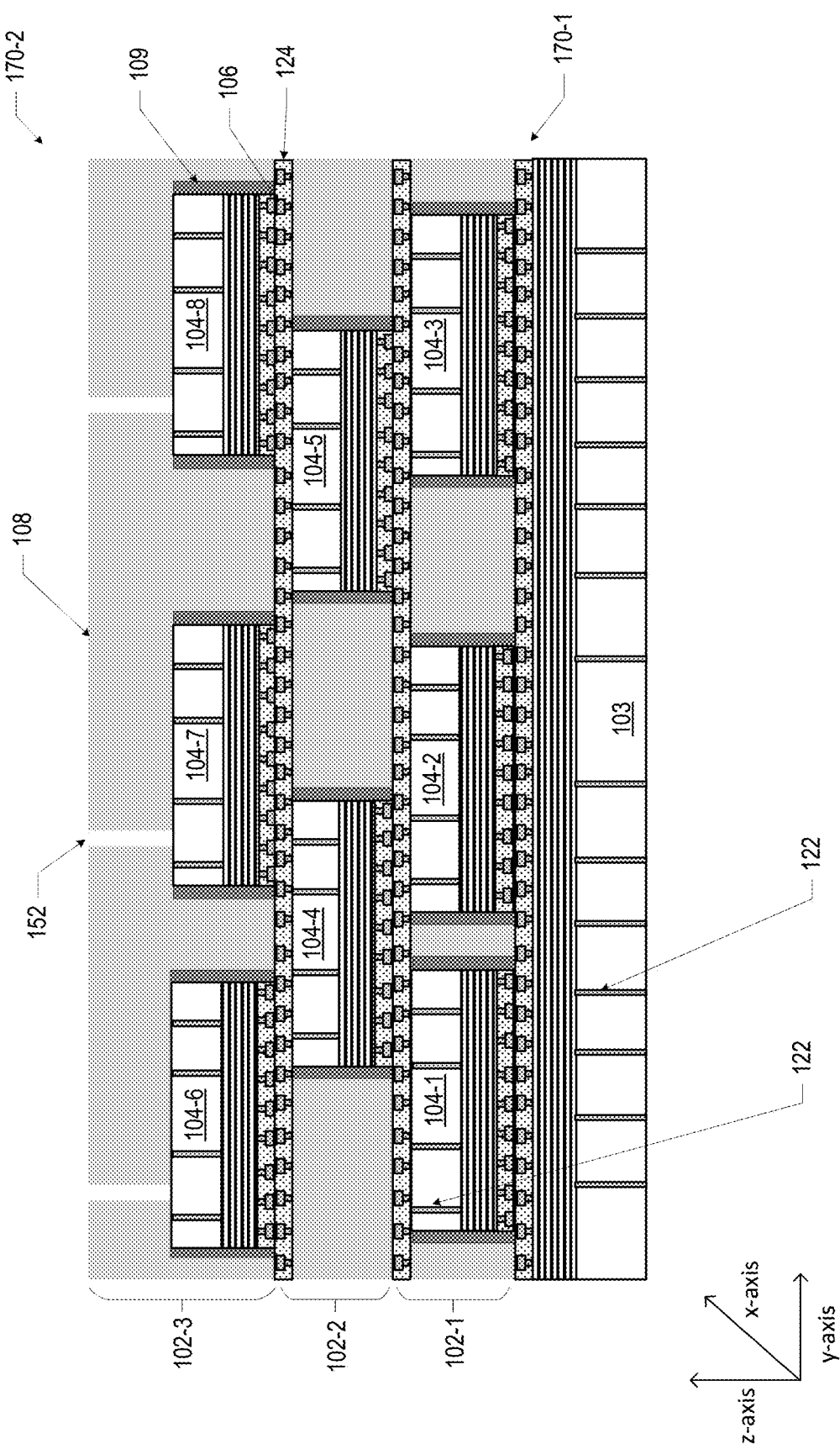

FIG. 5J illustrates an assembly subsequent to forming layer 102-3 by forming a bonding layer on a top surface of the assembly of 5I, attaching IC dies 104-6, 104-7, 104-8, forming interconnects 106, coupling a template structure 108, and depositing a fill material 109 in the spaces between the template structure 108 and the lateral surfaces of IC dies 104. Any suitable methods may be used to form layer 102-3, including the methods described above with reference to FIGS. 56-5E. In some embodiments, a thickness (e.g., a z-height) of the template structure 108 of layer 102-3 may be reduced by removing material from a top portion of the template structure 108.

Figure 5K:
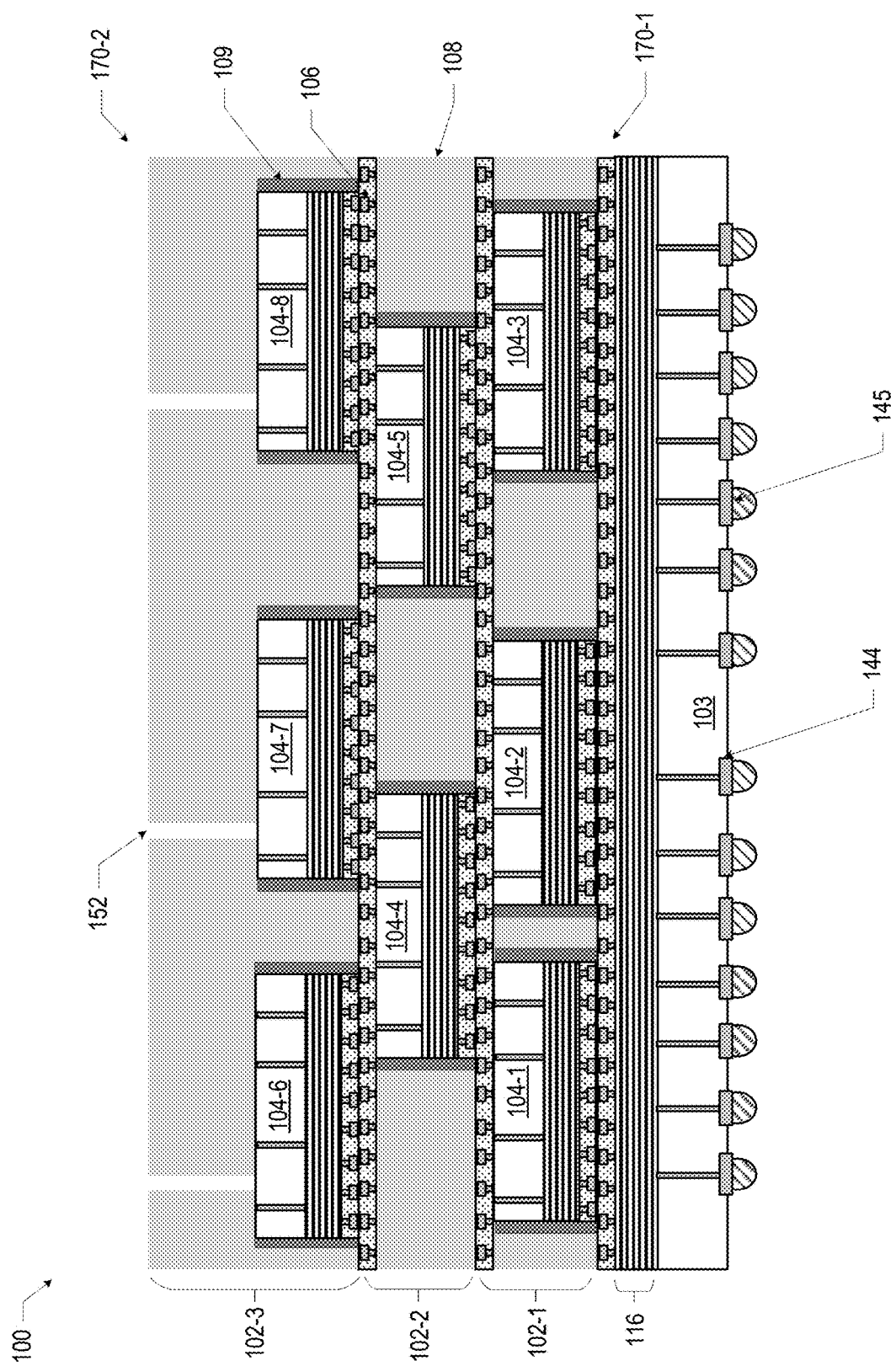

FIG. 5K illustrates an assembly subsequent to performing finishing operations on the bottom surface of the assembly of FIG. 5J (e.g., on a bottom surface of the base die 103), such as forming conductive contacts 144, depositing solder resist (not shown), and depositing solder 145 on a bottom surface of conductive contacts 144. If multiple assemblies are manufactured together, the assemblies may be singulated. The assembly of FIG. 5K may itself be a microelectronic assembly 100, as shown. Further manufacturing operations may be performed on the microelectronic assembly 100 of FIG. 5K to form other microelectronic assembly 100; for example, the solder 145 may be used to couple the microelectronic assembly 100 of FIG. 5K to a package substrate 118, similar to the microelectronic assembly 100 of FIG. 2A.

Figure 6:
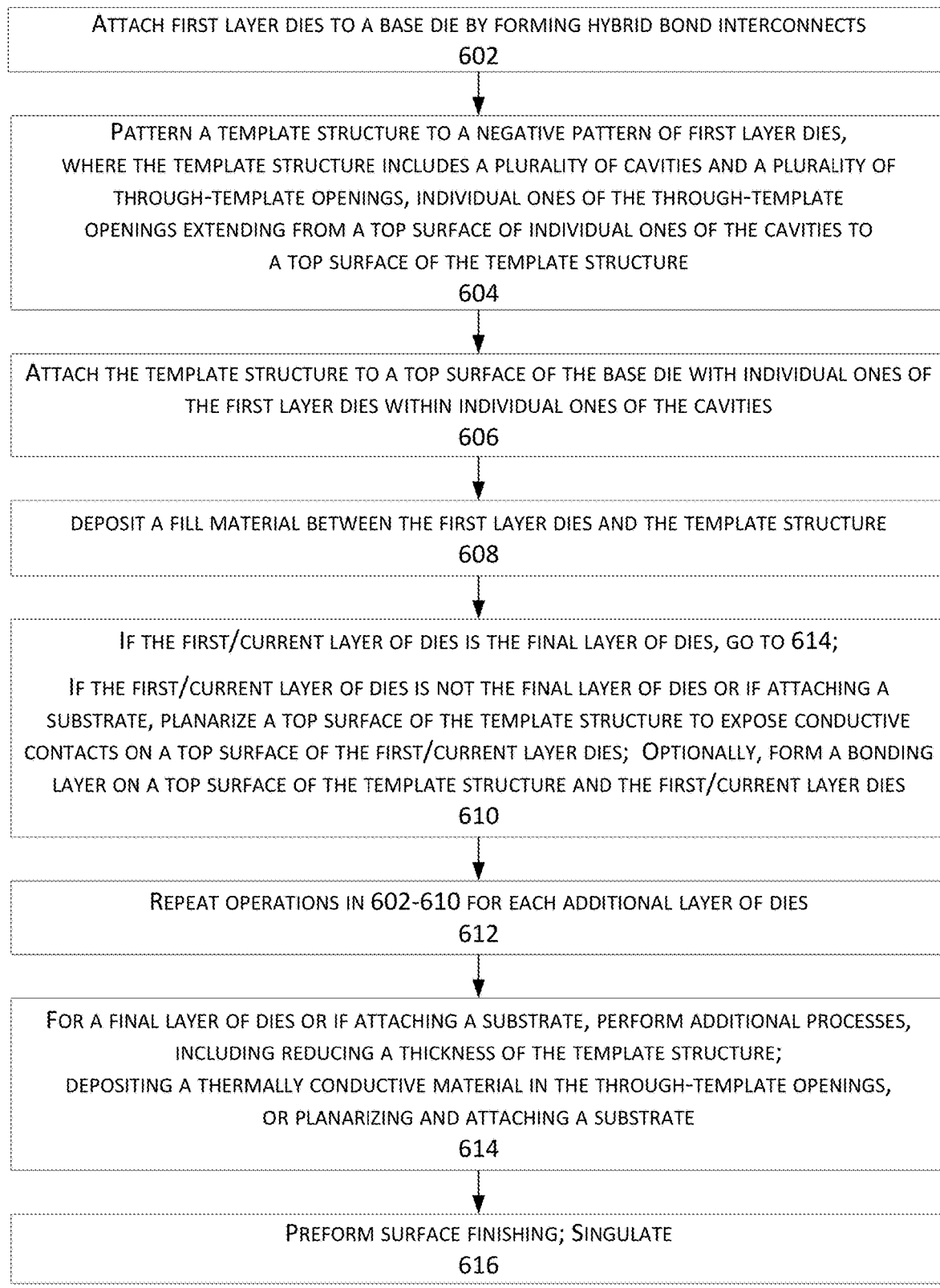
FIG. 6 is a schematic flow diagram listing example operations that may be associated with fabricating a microelectronic assembly according to some embodiments of the present disclosure.

FIG. 6 is a flow diagram of an example method of fabricating an example microelectronic assembly, in accordance with various embodiments. At 602, first layer 102 IC dies 104 may be attached to a base die 103 by forming interconnects 106.

At 604, a template structure 108 may be patterned to a negative pattern of first layer 102 IC dies 104, where the template structure 108 includes a plurality of cavities 151 and a plurality of through-template openings 152. Individual ones of the cavities 151 may correspond to individual ones of first layer 102 IC dies 104. Individual ones of the through-template openings 152 may extend from a top surface of individual ones of the cavities 151 to a top surface of the template structure 108.

At 606, the template structure 108 may be attached to a top surface of the base die 103 with individual ones of first layer 102 IC dies 104 within individual ones of the cavities 151. The template structure 108 may be coupled to the top surfaces of the base die 103 and first layer 102 IC dies 104 using any suitable technique, including by fusion bonding, by diffusion bonding, or by hybrid bonding.

At 608, a fill material 109 may be deposited in spaces between first layer 102 IC dies 104 and the template structures 108. In some embodiments, a fill material 109 may be omitted.

At 610, if the first or current layer 102 of IC dies 104 is the final layer 102 of IC dies 104, go to operation 614. Else if, additional layers 102 (e.g., layers 102-2, etc., as in FIG. 2A, FIG. 2B, and FIG. 3) are being formed or if a substrate 112 is being attached, a top surface of the template structure 108 may be planarized to expose TSVs 122 in IC dies 104, and a bonding layer may be formed on the top surface of the template structure 108 and IC dies 104.

At 612, operations described in 602-610 may be repeated for each additional layers 102 of IC dies 104.

At 614, for a final layer 102 of IC dies 104 or if attaching a substrate 112, additional processes may be performed on the assembly, for example, reducing a thickness (e.g., thinning a z-height) of the template structure 108, forming TTVs 153 by depositing a thermally conductive material in the through-template openings 152, and planarizing a top surface of the template structure 108 to expose TSVs 122 in IC dies 104 and attaching a substrate 112.

At 616, surface finishing operations may be performed on a bottom surface of the base die 103 and the assemblies by be singulated. In some embodiments, surface finishing operations may be performed subsequent to singulation. Surface finishing operations may include, for example, forming conductive contacts 144, dispensing solder resist, and attaching solder balls 145 at a bottom surface.

Figure 7:
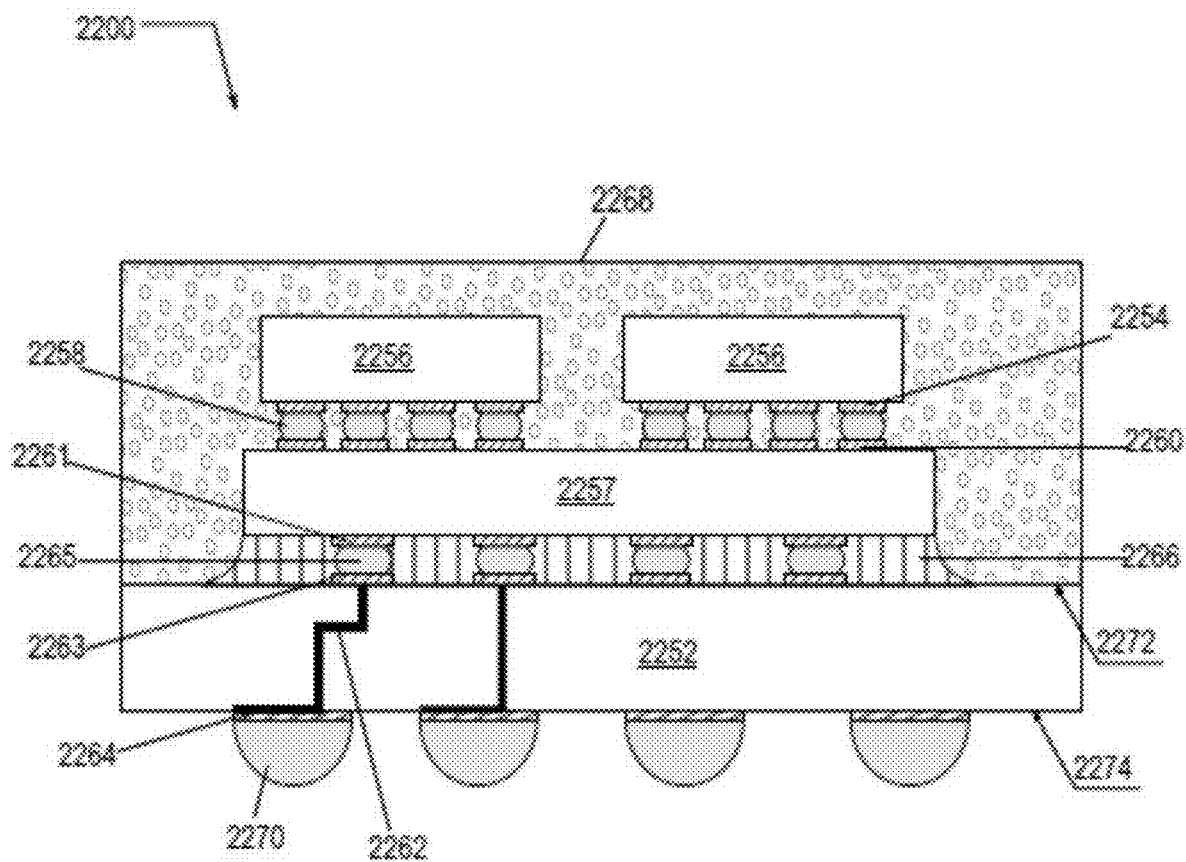
FIG. 7 is a cross-sectional view of a device package that includes one or more microelectronic assemblies in accordance with any of the embodiments disclosed herein.
Figure 8:
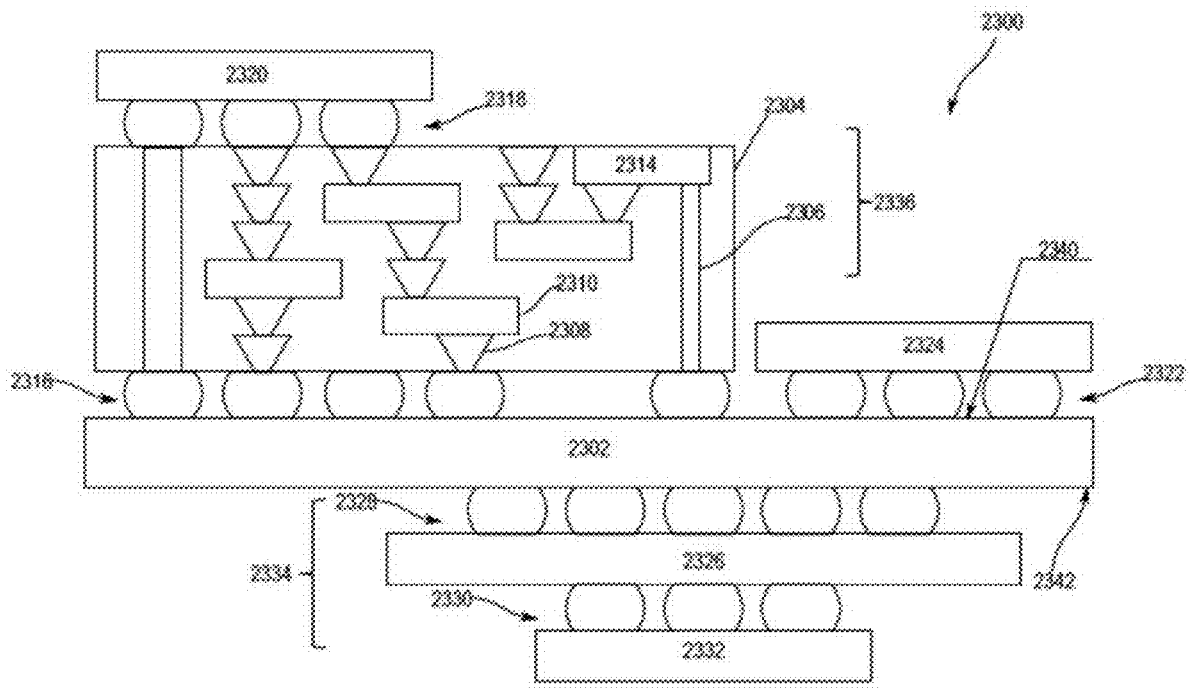
FIG. 8 is a cross-sectional side view of a device assembly that includes one or more microelectronic assemblies in accordance with any of the embodiments disclosed herein.
Figure 9:
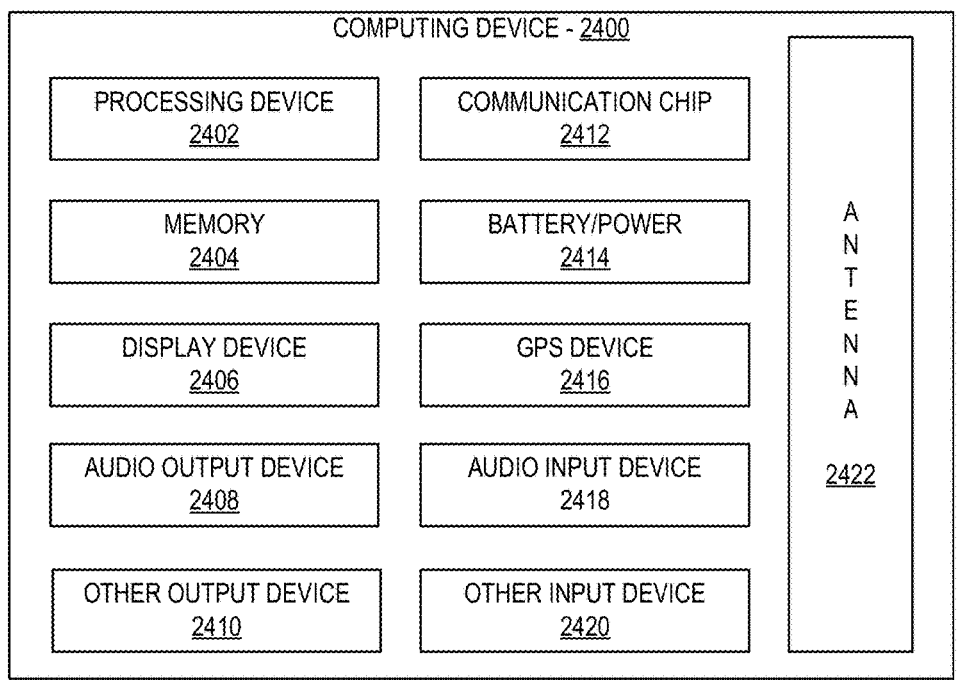
FIG. 9 is a block diagram of an example computing device that includes one or more microelectronic assemblies in accordance with any of the embodiments disclosed herein.

The packages disclosed herein, e.g., any of the microelectronic assemblies 100 or any further embodiments described herein, may be included in any suitable electronic component. FIGS. 7-9 illustrate various examples of packages, assemblies, and devices that may be used with or include any of the IC packages as disclosed herein.

FIG. 7 is a side, cross-sectional view of an example IC package 2200 that may include IC packages in accordance with any of the embodiments disclosed herein. In some embodiments, the IC package 2200 may be a SiP.

As shown in the figure, package substrate 2252 may be formed of an insulator (e.g., a ceramic, a buildup film, an epoxy film having filler particles therein, etc.), and may have conductive pathways extending through the insulator between first face 2272 and second face 2274, or between different locations on first face 2272, and/or between different locations on second face 2274. These conductive pathways may take the form of any of the interconnect structures comprising lines and/or vias.

Package substrate 2252 may include conductive contacts 2263 that are coupled to conductive pathway 2262 through package substrate 2252, allowing circuitry within dies 2256 and/or interposer 2257 to electrically couple to various ones of conductive contacts 2264 (or to other devices included in package substrate 2252, not shown).

IC package 2200 may include interposer 2257 coupled to package substrate 2252 via conductive contacts 2261 of interposer 2257, first-level interconnects 2265, and conductive contacts 2263 of package substrate 2252. First-level interconnects 2265 illustrated in the figure are solder bumps, but any suitable first-level interconnects 2265 may be used, such as solder bumps, solder posts, or bond wires.

IC package 2200 may include one or more dies 2256 coupled to interposer 2257 via conductive contacts 2254 of dies 2256, first-level interconnects 2258, and conductive contacts 2260 of interposer 2257. Conductive contacts 2260 may be coupled to conductive pathways (not shown) through interposer 2257, allowing circuitry within dies 2256 to electrically couple to various ones of conductive contacts 2261 (or to other devices included in interposer 2257, not shown). First-level interconnects 2258 illustrated in the figure are solder bumps, but any suitable first-level interconnects 2258 may be used, such as solder bumps, solder posts, or bond wires. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, underfill material 2266 may be disposed between package substrate 2252 and interposer 2257 around first-level interconnects 2265, and mold 2268 may be disposed around dies 2256 and interposer 2257 and in contact with package substrate 2252. In some embodiments, underfill material 2266 may be the same as mold 2268. Example materials that may be used for underfill material 2266 and mold 2268 are epoxies as suitable. Second-level interconnects 2270 may be coupled to conductive contacts 2264. Second-level interconnects 2270 illustrated in the figure are solder balls (e.g., for a ball grid array (BGA) arrangement), but any suitable second-level interconnects 2270 may be used (e.g., pins in a pin grid array arrangement or lands in a land grid array arrangement). Second-level interconnects 2270 may be used to couple IC package 2200 to another component, such as a circuit board (e.g., a motherboard), an interposer, or another IC package, as known in the art and as discussed below with reference to FIG. 8.

In various embodiments, any of dies 2256 may be microelectronic assembly 100 as described herein. In embodiments in which IC package 2200 includes multiple dies 2256, IC package 2200 may be referred to as a multi-chip package (MCP). Dies 2256 may include circuitry to perform any desired functionality. For example, besides one or more of dies 2256 being microelectronic assembly 100 as described herein, one or more of dies 2256 may be logic dies (e.g., silicon-based dies), one or more of dies 2256 may be memory dies (e.g., HBM), etc. In some embodiments, any of dies 2256 may be implemented as discussed with reference to any of the previous figures. In some embodiments, at least some of dies 2256 may not include implementations as described herein.

Although IC package 2200 illustrated in the figure is a flip-chip package, other package architectures may be used. For example, IC package 2200 may be a BGA package, such as an embedded wafer-level ball grid array (eWLB) package. In another example, IC package 2200 may be a wafer-level chip scale package (WLCSP) or a panel fan-out (FO) package. Although two dies 2256 are illustrated in IC package 2200, IC package 2200 may include any desired number of dies 2256. IC package 2200 may include additional passive components, such as surface-mount resistors, capacitors, and inductors disposed over first face 2272 or second face 2274 of package substrate 2252, or on either face of interposer 2257. More generally, IC package 2200 may include any other active or passive components known in the art.

In some embodiments, no interposer 2257 may be included in IC package 2200; instead, dies 2256 may be coupled directly to conductive contacts 2263 at first face 2272 by first-level interconnects 2265.

FIG. 8 is a cross-sectional side view of an IC device assembly 2300 that may include components having one or more microelectronic assembly 100 in accordance with any of the embodiments disclosed herein. IC device assembly 2300 includes a number of components disposed over a circuit board 2302 (which may be, e.g., a motherboard). IC device assembly 2300 includes components disposed over a first face 2340 of circuit board 2302 and an opposing second face 2342 of circuit board 2302; generally, components may be disposed over one or both faces 2340 and 2342. In particular, any suitable ones of the components of IC device assembly 2300 may include any of the one or more microelectronic assembly 100 in accordance with any of the embodiments disclosed herein; e.g., any of the IC packages discussed below with reference to IC device assembly 2300 may take the form of any of the embodiments of IC package 2200 discussed above with reference to FIG. 7.

In some embodiments, circuit board 2302 may be a PCB including multiple metal layers separated from one another by layers of insulator and interconnected by electrically conductive vias. Any one or more of the metal layers may be formed in a desired circuit pattern to route electrical signals (optionally in conjunction with other metal layers) between the components coupled to circuit board 2302. In other embodiments, circuit board 2302 may be a non-PCB package substrate.

As illustrated in the figure, in some embodiments, IC device assembly 2300 may include a package-on-interposer structure 2336 coupled to first face 2340 of circuit board 2302 by coupling components 2316. Coupling components 2316 may electrically and mechanically couple package-on-interposer structure 2336 to circuit board 2302, and may include solder balls (as shown), male and female portions of a socket, an adhesive, an underfill material, and/or any other suitable electrical and/or mechanical coupling structure.

Package-on-interposer structure 2336 may include IC package 2320 coupled to interposer 2304 by coupling components 2318. Coupling components 2318 may take any suitable form depending on desired functionalities, such as the forms discussed above with reference to coupling components 2316. In some embodiments, IC package 2320 may be or include IC package 2200, e.g., as described above with reference to FIG. In some embodiments, IC package 2320 may include at least one microelectronic assembly 100 as described herein. Microelectronic assembly 100 is not specifically shown in the figure in order to not clutter the drawing.

Although a single IC package 2320 is shown in the figure, multiple IC packages may be coupled to interposer 2304; indeed, additional interposers may be coupled to interposer 2304. Interposer 2304 may provide an intervening package substrate used to bridge circuit board 2302 and IC package 2320. Generally, interposer 2304 may redistribute a connection to a wider pitch or reroute a connection to a different connection. For example, interposer 2304 may couple IC package 2320 to a BGA of coupling components 2316 for coupling to circuit board 2302.

In the embodiment illustrated in the figure, IC package 2320 and circuit board 2302 are attached to opposing sides of interposer 2304. In other embodiments, IC package 2320 and circuit board 2302 may be attached to a same side of interposer 2304. In some embodiments, three or more components may be interconnected by way of interposer 2304.

Interposer 2304 may be formed of an epoxy resin, a fiberglass-reinforced epoxy resin, a ceramic material, or a polymer material such as polyimide. In some implementations, interposer 2304 may be formed of alternate rigid or flexible materials that may include the same materials described above for use in a semiconductor substrate, such as silicon, germanium, and other group III-V and group IV materials. Interposer 2304 may include metal interconnects 2308 and vias 2310, including but not limited to TSVs 2306. Interposer 2304 may further include embedded devices 2314, including both passive and active devices. Such devices may include, but are not limited to, capacitors, decoupling capacitors, resistors, inductors, fuses, diodes, transformers, sensors, ESD devices, and memory devices. More complex devices such as radio frequency (RF) devices, power amplifiers, power management devices, antennas, arrays, sensors, and microelectromechanical systems (MEMS) devices may also be formed on interposer 2304. Package-on-interposer structure 2336 may take the form of any of the package-on-interposer structures known in the art.

In some embodiments, IC device assembly 2300 may include an IC package 2324 coupled to first face 2340 of circuit board 2302 by coupling components 2322. Coupling components 2322 may take the form of any of the embodiments discussed above with reference to coupling components 2316, and IC package 2324 may take the form of any of the embodiments discussed above with reference to IC package 2320.

In some embodiments, IC device assembly 2300 may include a package-on-package structure 2334 coupled to second face 2342 of circuit board 2302 by coupling components 2328. Package-on-package structure 2334 may include an IC package 2326 and an IC package 2332 coupled together by coupling components 2330 such that IC package 2326 is disposed between circuit board 2302 and IC package 2332. Coupling components 2328 and 2330 may take the form of any of the embodiments of coupling components 2316 discussed above, and IC packages 2326 and/or 2332 may take the form of any of the embodiments of IC package 2320 discussed above. Package-on-package structure 2334 may be configured in accordance with any of the package-on-package structures known in the art.

FIG. 9 is a block diagram of an example computing device 2400 that may include one or more components having one or more IC packages in accordance with any of the embodiments disclosed herein. For example, any suitable ones of the components of computing device 2400 may include a microelectronic assembly (e.g., 100) in accordance with any of the embodiments disclosed herein. In another example, any one or more of the components of computing device 2400 may include any embodiments of IC package 2200 (e.g., as shown in FIG. 7). In yet another example, any one or more of the components of computing device 2400 may include an IC device assembly 2300 (e.g., as shown in FIG. 8).

A number of components are illustrated in the figure as included in computing device 2400, but any one or more of these components may be omitted or duplicated, as suitable for the application. In some embodiments, some or all of the components included in computing device 2400 may be attached to one or more motherboards. In some embodiments, some or all of these components are fabricated onto a single SoC die.

Additionally, in various embodiments, computing device 2400 may not include one or more of the components illustrated in the figure, but computing device 2400 may include interface circuitry for coupling to the one or more components. For example, computing device 2400 may not include a display device 2406, but may include display device interface circuitry (e.g., a connector and driver circuitry) to which display device 2406 may be coupled. In another set of examples, computing device 2400 may not include an audio input device 2418 or an audio output device 2408, but may include audio input or output device interface circuitry (e.g., connectors and supporting circuitry) to which audio input device 2418 or audio output device 2408 may be coupled.

Computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. Processing device 2402 may include one or more DSPs, ASICs, CPUs, GPUs, cryptoprocessors (specialized processors that execute cryptographic algorithms within hardware), server processors, or any other suitable processing devices. Computing device 2400 may include a memory 2404, which may itself include one or more memory devices such as volatile memory (e.g., dynamic random access memory (DRAM)), nonvolatile memory (e.g., read-only memory (ROM)), flash memory, solid-state memory, and/or a hard drive. In some embodiments, memory 2404 may include memory that shares a die with processing device 2402. This memory may be used as cache memory and may include embedded dynamic random access memory (eDRAM) or spin transfer torque magnetic random access memory (STT-MRAM).

In some embodiments, computing device 2400 may include a communication chip 2412 (e.g., one or more communication chips). For example, communication chip 2412 may be configured for managing wireless communications for the transfer of data to and from computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), LTE project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 2412 may operate in accordance with other wireless protocols in other embodiments. Computing device 2400 may include an antenna 2422 to facilitate wireless communications and/or to receive other wireless communications (such as AM or FM radio transmissions).

In some embodiments, communication chip 2412 may manage wired communications, such as electrical, optical, or any other suitable communication protocols (e.g., the Ethernet). As noted above, communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

Computing device 2400 may include battery/power circuitry 2414. Battery/power circuitry 2414 may include one or more energy storage devices (e.g., batteries or capacitors) and/or circuitry for coupling components of computing device 2400 to an energy source separate from computing device 2400 (e.g., AC line power).

Computing device 2400 may include a display device 2406 (or corresponding interface circuitry, as discussed above). Display device 2406 may include any visual indicators, such as a heads-up display, a computer monitor, a projector, a touchscreen display, a liquid crystal display (LCD), a light-emitting diode display, or a flat panel display, for example.

Computing device 2400 may include audio output device 2408 (or corresponding interface circuitry, as discussed above). Audio output device 2408 may include any device that generates an audible indicator, such as speakers, headsets, or earbuds, for example.

Computing device 2400 may include audio input device 2418 (or corresponding interface circuitry, as discussed above). Audio input device 2418 may include any device that generates a signal representative of a sound, such as microphones, microphone arrays, or digital instruments (e.g., instruments having a musical instrument digital interface (MIDI) output).

Computing device 2400 may include a GPS device 2416 (or corresponding interface circuitry, as discussed above). GPS device 2416 may be in communication with a satellite-based system and may receive a location of computing device 2400, as known in the art.

Computing device 2400 may include other output device 2410 (or corresponding interface circuitry, as discussed above). Examples of other output device 2410 may include an audio codec, a video codec, a printer, a wired or wireless transmitter for providing information to other devices, or an additional storage device.

Computing device 2400 may include other input device 2420 (or corresponding interface circuitry, as discussed above). Examples of other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, computing device 2400 may be any other electronic device that processes data.

The above description of illustrated implementations of the disclosure, including what is described in the abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

Example 1 is a microelectronic assembly, including a first die having a surface; a template structure having a first surface and an opposing second surface, wherein the first surface of the template structure is coupled to the surface of the first die, and wherein the template structure includes a cavity at the first surface and a through-template opening extending from a top surface of the cavity to the second surface of the template structure; and a second die within the cavity of the template structure and electrically coupled to the surface of the first die by interconnects having a pitch of less than 10 microns between adjacent interconnects.

Example 2 may include the subject matter of Example 1, and may further specify that a material of the template structure includes silicon, aluminum and nitrogen, a ceramic, or a metal.

Example 3 may include the subject matter of Examples 1 or 2, and may further specify that an overall thickness of the template structure is between 70 microns and 800 microns.

Example 4 may include the subject matter of any of Examples 1-3, and may further specify that a depth of the cavity is between 20 microns and 45 microns.

Example 5 may include the subject matter of any of Examples 1-4, and may further specify that the first surface of the template structure is coupled to the surface of the first die by fusion bonding.

Example 6 may include the subject matter of any of Examples 1-4, and may further specify that the interconnects are first interconnects, and wherein the first surface of the template structure is coupled to the surface of the first die by second interconnects having a pitch of less than 10 microns between adjacent second interconnects.

Example 7 may include the subject matter of any of Examples 1-6, and may further specify that the second die includes lateral surfaces extending between the first and second surfaces, and the microelectronic assembly and may further include: a fill material between the lateral surfaces of the second die and the template structure.

Example 8A may include the subject matter of Example 7, and may further specify that the fill material includes a thermally conductive material.

Example 8B may include the subject matter of Example 7, and may further specify that the fill material includes an oxide material, glass, a thermal interface material (TIM), a capillary underfill material, an inorganic dielectric, an epoxy, solder, a metal, or a polymer having conductive particles.

Example 9A may include the subject matter of any of Examples 1-8, and may further specify that the cavity is one of a plurality of cavities, the through-template opening is one of a plurality of through-template openings, and the second die is one of a plurality of second dies.

Example 9B may include the subject matter of any of Examples 1-8, and may further specify that the through-template opening includes a capillary underfill material with conductive fillers, an epoxy with conductive fillers, solder, a metal, or a polymer having conductive particles.

Example 10 may include the subject matter of any of Examples 1-9, and may further specify that the surface of the first die is a second surface, and the first die further includes a first surface opposite the second surface and through-silicon vias (TSVs), and the microelectronic assembly further including a package substrate electrically coupled to the first surface of the first die by solder interconnects.

Example 11 is a microelectronic assembly, including a first die having a surface; a first layer at the surface of the first die, the first layer including a second die electrically coupled to the surface of the first die by first interconnects having a pitch of less than 10 microns between adjacent first interconnects, and a first template structure on the surface of the first die and around the second die; a second layer on the first layer, the second layer including a third die, a fourth die, and a second template structure, wherein the third die and the fourth die are electrically coupled to the second die by second interconnects having a pitch of less than 10 microns between adjacent second interconnects, wherein the second template structure has a first surface coupled to the first layer and an opposing second surface and the second template structure includes a first cavity and a second cavity at the first surface, a first through-template opening extending from a top surface of the first cavity to the second surface of the second template structure, and a second through-template opening extending from a top surface of the second cavity to the second surface of the second template structure, and wherein the third die is within the first cavity and the fourth die is within the second cavity.

Example 12 may include the subject matter of Example 11, and may further specify that a material of the template structure includes silicon, aluminum and nitrogen, a ceramic, or a metal.

Example 13 may include the subject matter of Examples 11 or 12, and may further specify that the second template structure further includes a fluidic channel.

Example 14 may include the subject matter of Example 13, and may further include a fluid in the fluidic channel, wherein the fluid includes water, a fluorochemical liquid, silicone oil, ethylene glycol water, poly-alpha-olefin, silicate ester, helium, argon, or nitrogen.

Example 15 may include the subject matter of any of Examples 11-14, and may further specify that an overall thickness of the second template structure is between 70 microns and 800 microns.

Example 16 may include the subject matter of any of Examples 11-15, and may further specify that a depth of the second cavity is between 20 microns and 45 microns.

Example 17 may include the subject matter of any of Examples 11-16, and may further specify that the second die includes a first surface, an opposing second surface, and lateral surfaces extending between the first and second surfaces, and the microelectronic assembly and may further include a fill material between the lateral surfaces of the second die and the template structure.

Example 18 may include the subject matter of Example 17, and may further specify that the fill material includes a thermally conductive material.

Example 19 may include the subject matter of any of Examples 11-18, and may further include a heat sink at the second surface of the second template structure.

Example 20 may include the subject matter of Example 19, and may further include a thermal interface material (TIM) between the heat sink and the second surface of the second template structure.

Example 21 is a microelectronic assembly, including a first die having a surface; a plurality of second dies having a first surface and an opposing second surface, wherein the first surfaces of the plurality of second dies are at the surface of the first die, and wherein the plurality of second dies are electrically coupled to the first die by first interconnects having a pitch of less than 10 microns between adjacent first interconnects; a first template structure around and between the plurality of second dies; a plurality of third dies having a first surface and an opposing second surface, wherein the first surfaces of the plurality of third dies are at the second surfaces of the plurality of second dies, and wherein the plurality of third dies are electrically coupled to the plurality of second dies by second interconnects having a pitch of less than 10 microns between adjacent second interconnects; a second template structure around and between the plurality of third dies, the second template structure having a first surface at the second surfaces of the plurality of second dies and an opposing second surface; and a substrate coupled to the second surface of the second template structure.

Example 22 may include the subject matter of Example 21, and may further specify that a material of the first and second template structures includes silicon, aluminum and nitrogen, a ceramic, or a metal.

Example 23 may include the subject matter of Examples 21 or 22, and may further specify that a material of the substrate includes silicon.

Example 24 may include the subject matter of any of Examples 21-23, and may further specify that the substrate is bonded to the second surface of the second template structure.

Example 25 may include the subject matter of any of Examples 21-24, and may further specify that a thickness of the substrate is between 50 microns and 800 microns.

Example 26 may include the subject matter of any of Examples 21-25, and may further specify that the plurality of second dies and the plurality of third dies include lateral surfaces extending between the first and second surfaces, and the microelectronic assembly and may further include a fill material between the lateral surfaces of the plurality of second dies and the first template structure, and between the lateral surfaces of the plurality of third dies and the second template structure.

Example 27 may include the subject matter of Example 26, and may further specify that the fill material includes a thermally conductive material.

Example 28 may include the subject matter of any of Examples 21-27, and may further specify that the surface of the first die is a second surface, and the first die further includes a first surface opposite the second surface and through-silicon vias (TSVs), and the microelectronic assembly further including a package substrate electrically coupled to the first surface of the first die by third interconnects.

Example 29 may include the subject matter of Example 28, and may further specify that the third interconnects include solder.

Example 30 is a method of manufacturing a microelectronic assembly, including attaching a second die to a surface of a first die by interconnects, wherein the interconnects having a pitch of less than 10 microns between adjacent interconnects; and attaching a template structure to the surface of the first die, wherein the template structure has a first surface and an opposing second surface, wherein the template structure includes a cavity in the first surface and a through-template opening extending from a top surface of the cavity to the second surface of the template structure, and wherein the second die is within the cavity.

Example 31 may include the subject matter of Example 30, and may further specify that the second die has a first surface, an opposing second surface, and lateral surfaces extending between the first and second surfaces, and the method may further include depositing a fill material between the lateral surfaces of the second die and the template structure.

Example 32 may include the subject matter of Example 31, and may further specify that the fill material includes a thermally conductive material.

Example 33 may include the subject matter of any of Examples 30-32, and may further specify that a material of the template structure includes silicon.

Example 34 may include the subject matter of any of Examples 30-33, and may further specify that the cavity is one of a plurality of cavities, the through-template opening is one of a plurality of through-template openings, and the second die is one of a plurality of second dies.

Example 35 may include the subject matter of any of Examples 30-34, and may further specify that the surface of the first die is a second surface and the first die further includes a first surface opposite the second surface, and the method may further include electrically coupling a package substrate to the first surface of the first die.

Example 36 is a method of manufacturing a microelectronic assembly, including attaching a plurality of second dies to a surface of a first die by first interconnects, wherein the first interconnects have a pitch of less than 10 microns between adjacent first interconnects; attaching a first template structure around and between the plurality of second dies; attaching a plurality of third dies to the plurality of second dies by second interconnects, wherein the second interconnects have a pitch of less than 10 microns between adjacent second interconnects; and attaching a second template structure around and between the plurality of third dies, wherein the second template structure has a first surface and an opposing second surface, wherein the second template structure includes a plurality of cavities at the first surface and a plurality of through-template openings, wherein individual ones of the plurality of through-template openings extending from a top surface of individual ones of the plurality of cavities to the second surface of the template structure, and wherein individual ones of the plurality of third dies are within individual ones of the plurality of cavities.

Example 37 may include the subject matter of Example 36, and may further specify that the plurality of second dies and the plurality of third dies have a first surface, an opposing second surface, and lateral surfaces extending between the first and second surfaces, and the method may further include depositing a fill material between the lateral surfaces of the plurality of second dies and the first template structure and between the lateral surfaces of the plurality of third dies and the second template structure.

Example 38 may include the subject matter of Example 37, and may further specify that the fill material includes a thermally conductive material.

Example 39 may include the subject matter of any of Examples 36-38, and may further specify that a material of the first and second template structures includes silicon.

Example 40 may include the subject matter of any of Examples 36-39, and may further specify that the surface of the first die is a second surface and the first die further includes a first surface opposite the second surface, and the method may further include electrically coupling a package substrate to the first surface of the first die.

The invention claimed is:

1. A microelectronic assembly, comprising:
    a first die having a surface;
    a template structure having a first surface and an opposing second surface, wherein the first surface of the template structure is coupled to the surface of the first die, and wherein the template structure includes a cavity at the first surface and a through-template opening extending from a top surface of the cavity to the second surface of the template structure; and
    a second die within the cavity of the template structure and electrically coupled to the surface of the first die by interconnects having a pitch of less than 10 microns between adjacent interconnects.

2. The microelectronic assembly of claim 1, wherein a material of the template structure includes silicon, aluminum and nitrogen, a ceramic, or a metal.

3. The microelectronic assembly of claim 1, wherein an overall thickness of the template structure is between 70 microns and 800 microns.

4. The microelectronic assembly of claim 1, wherein a depth of the cavity is between 20 microns and 45 microns.

5. The microelectronic assembly of claim 1, wherein the first surface of the template structure is coupled to the surface of the first die by fusion bonding.

6. The microelectronic assembly of claim 1, wherein the interconnects are first interconnects, and wherein the first surface of the template structure is coupled to the surface of the first die by second interconnects having a pitch of less than 10 microns between adjacent second interconnects.

7. The microelectronic assembly of claim 1, wherein the second die includes lateral surfaces extending between the first and second surfaces, and the microelectronic assembly further comprising:
    a fill material between the lateral surfaces of the second die and the template structure.

8. The microelectronic assembly of claim 7, wherein the fill material includes a conductive material.

9. The microelectronic assembly of claim 1, wherein the through-template opening includes a capillary underfill material with conductive fillers, an epoxy with conductive fillers, solder, a metal, or a polymer having conductive particles.

10. The microelectronic assembly of claim 1, wherein the surface of the first die is a second surface, and the first die further includes a first surface opposite the second surface and through-silicon vias (TSVs), and the microelectronic assembly further including:
    a package substrate electrically coupled to the first surface of the first die by solder interconnects.

11. A microelectronic assembly, comprising:
a first die having a surface;
a first layer at the surface of the first die, the first layer including a second die electrically coupled to the surface of the first die by first interconnects having a pitch of less than 10 microns between adjacent first interconnects, and a first template structure on the surface of the first die and around the second die; and
a second layer on the first layer, the second layer including a third die, a fourth die, and a second template structure, wherein the third die and the fourth die are electrically coupled to the second die by second interconnects having a pitch of less than 10 microns between adjacent second interconnects, wherein the second template structure has a first surface coupled to the first layer and an opposing second surface and the second template structure includes a first cavity and a second cavity at the first surface, a first through-template opening extending from a top surface of the first cavity to the second surface of the second template structure, and a second through-template opening extending from a top surface of the second cavity to the second surface of the second template structure, and wherein the third die is within the first cavity and the fourth die is within the second cavity.

12. The microelectronic assembly of claim 11, wherein a material of the template structure includes silicon, aluminum and nitrogen, a ceramic, or a metal.

13. The microelectronic assembly of claim 11, wherein the second template structure further includes a fluidic channel.

14. The microelectronic assembly of claim 13, further comprising:
a fluid in the fluidic channel, wherein the fluid includes water, a fluorochemical liquid, silicone oil, ethylene glycol water, poly-alpha-olefin, silicate ester, helium, argon, or nitrogen.

15. The microelectronic assembly of claim 11, further comprising:
a heat sink at the second surface of the second template structure.

16. The microelectronic assembly of claim 15, further comprising:
a thermal interface material (TIM) between the heat sink and the second surface of the second template structure.

17. A microelectronic assembly, comprising:
a first die having a surface;
a plurality of second dies having a first surface and an opposing second surface, wherein the first surfaces of the plurality of second dies are at the surface of the first die, and wherein the plurality of second dies are electrically coupled to the first die by first interconnects having a pitch of less than 10 microns between adjacent first interconnects;
a first template structure around and between the plurality of second dies;
a plurality of third dies having a first surface and an opposing second surface, wherein the first surfaces of the plurality of third dies are at the second surfaces of the plurality of second dies, and wherein the plurality of third dies are electrically coupled to the plurality of second dies by second interconnects having a pitch of less than 10 microns between adjacent second interconnects;
a second template structure around and between the plurality of third dies, the second template structure having a first surface at the second surfaces of the plurality of second dies and an opposing second surface; and
a substrate coupled to the second surface of the second template structure.

18. The microelectronic assembly of claim 17, wherein a material of the first and second template structures includes silicon, aluminum and nitrogen, a ceramic, or a metal.

19. The microelectronic assembly of claim 17, wherein a material of the substrate includes silicon.

20. The microelectronic assembly of claim 17, wherein a thickness of the substrate is between 50 microns and 800 microns.

* * * * *